(12) United States Patent
Honda

(10) Patent No.: US 12,504,694 B2
(45) Date of Patent: Dec. 23, 2025

(54) EXTREME ULTRAVIOLET LIGHT GENERATION CHAMBER DEVICE AND ELECTRONIC DEVICE MANUFACTURING METHOD

(71) Applicant: Gigaphoton Inc., Tochigi (JP)

(72) Inventor: Yoshiyuki Honda, Oyama (JP)

(73) Assignee: Gigaphoton Inc., Tochigi (JP)

( * ) Notice: Subject to any disclaimer, the term of this patent is extended or adjusted under 35 U.S.C. 154(b) by 169 days.

(21) Appl. No.: 18/477,089

(22) Filed: Sep. 28, 2023

(65) Prior Publication Data
US 2024/0160107 A1  May 16, 2024

(30) Foreign Application Priority Data
Nov. 16, 2022  (JP) ................. 2022-183560

(51) Int. Cl.
*G03F 7/20* (2006.01)
*G03F 7/00* (2006.01)
*G21K 1/06* (2006.01)
*H05G 2/00* (2006.01)

(52) U.S. Cl.
CPC .......... *G03F 7/70033* (2013.01); *G21K 1/06* (2013.01); *H05G 2/0094* (2024.08)

(58) Field of Classification Search
CPC .............. G03F 7/70033; G03F 7/7085; G03F 7/70925; G03F 7/70175; G21K 1/06; H05G 2/0094; H05G 2/003; H05G 2/008; H05G 2/005
See application file for complete search history.

(56) References Cited

U.S. PATENT DOCUMENTS

| 9,776,218 B2 | 10/2017 | De Dea et al. |
| 10,034,362 B2 | 7/2018 | Kuritsyn et al. |
| 2021/0235571 A1* | 7/2021 | Ueda ............... H05G 2/007 |

FOREIGN PATENT DOCUMENTS

JP   2008-041391 A   2/2008

* cited by examiner

*Primary Examiner* — Mesfin T Asfaw
(74) *Attorney, Agent, or Firm* — Studebaker Brackett PLLC

(57) ABSTRACT

An extreme ultraviolet light generation chamber device includes a chamber generating, at an internal space thereof, extreme ultraviolet light by irradiating a droplet target of tin with laser light to turn the droplet target into plasma; a target supply unit supplying the droplet target into the internal space; an extreme ultraviolet light concentrating mirror arranged in the internal space and including a reflection surface which reflects the extreme ultraviolet light; a first etching gas supply unit supplying an etching gas containing a hydrogen gas to the reflection surface having a flow velocity at the reflection surface variable; a data generation unit generating data reflecting reflectance of the extreme ultraviolet concentrating mirror; and a processor controlling the first etching gas supply unit to decrease the flow velocity when the data indicates that an amount of decrease in the reflectance is equal to or more than a reference value.

18 Claims, 20 Drawing Sheets

EXTREME ULTRAVIOLET LIGHT GENERATION CHAMBER DEVICE AND ELECTRONIC DEVICE MANUFACTURING METHOD

CROSS-REFERENCE TO RELATED APPLICATIONS

The present application claims the benefit of Japanese Patent Application No. 2022-183560, filed on Nov. 16, 2022, the entire contents of which are hereby incorporated by reference.

BACKGROUND

1. Technical Field

The present disclosure relates to an extreme ultraviolet light generation chamber device and an electronic device manufacturing method.

2. Related Art

Recently, miniaturization of a transfer pattern in optical lithography of a semiconductor process has been rapidly proceeding along with miniaturization of the semiconductor process. In the next generation, microfabrication at 10 nm or less will be required. Therefore, it is expected to develop a semiconductor exposure apparatus that combines an apparatus for generating extreme ultraviolet (EUV) light having a wavelength of about 13 nm with a reduced projection reflection optical system.

As the EUV light generation apparatus, a laser produced plasma (LPP) type apparatus using plasma generated by irradiating a target substance with laser light has been developed.

LIST OF DOCUMENTS

Patent Documents

Patent Document 1: U.S. patent Ser. No. 10/034,362
Patent Document 2: U.S. Pat. No. 9,776,218
Patent Document 3: Japanese Patent Application Publication No. 2008-41391

SUMMARY

An extreme ultraviolet light generation chamber device according to an aspect of the present disclosure may include a chamber configured to generate, at an internal space thereof, extreme ultraviolet light by irradiating a droplet target of tin with laser light to turn the droplet target into plasma; a target supply unit configured to supply the droplet target into the internal space; an extreme ultraviolet light concentrating mirror arranged in the internal space and including a reflection surface which reflects the extreme ultraviolet light; a first etching gas supply unit configured to supply an etching gas containing a hydrogen gas to the reflection surface having a flow velocity at the reflection surface variable; a data generation unit configured to generate data reflecting reflectance of the extreme ultraviolet concentrating mirror; and a processor configured to control the first etching gas supply unit to decrease the flow velocity when the data indicates that an amount of decrease in the reflectance is equal to or more than a reference value.

Further, an electronic device manufacturing method according to an aspect of the present disclosure may include outputting extreme ultraviolet light generated using an extreme ultraviolet light generation apparatus to an exposure apparatus, and exposing a photosensitive substrate to the extreme ultraviolet light in the exposure apparatus to manufacture an electronic device. Here, the extreme ultraviolet light generation apparatus included an extreme ultraviolet light generation chamber device including a chamber configured to generate, at an internal space thereof, the extreme ultraviolet light by irradiating a droplet target of tin with laser light to turn the droplet target into plasma; a target supply unit configured to supply the droplet target into the internal space; an extreme ultraviolet light concentrating mirror arranged in the internal space and including a reflection surface which reflects the extreme ultraviolet light; a first etching gas supply unit configured to supply an etching gas containing a hydrogen gas to the reflection surface having a flow velocity at the reflection surface variable; a data generation unit configured to generate data reflecting reflectance of the extreme ultraviolet concentrating mirror; and a processor configured to control the first etching gas supply unit to decrease the flow velocity when the data indicates that an amount of decrease in the reflectance is equal to or more than a reference value.

Further, an electronic device manufacturing method according to an aspect of the present disclosure may include inspecting a defect of a mask by irradiating the mask with extreme ultraviolet light generated using an extreme ultraviolet light generation apparatus, selecting a mask using a result of the inspection, and exposing and transferring a pattern formed on the selected mask onto a photosensitive substrate. Here, the extreme ultraviolet light generation apparatus includes an extreme ultraviolet light generation chamber device including a chamber configured to generate, at an internal space thereof, extreme ultraviolet light by irradiating a droplet target of tin with laser light to turn the droplet target into plasma; a target supply unit configured to supply the droplet target into the internal space; an extreme ultraviolet light concentrating mirror arranged in the internal space and including a reflection surface which reflects the extreme ultraviolet light; a first etching gas supply unit configured to supply an etching gas containing a hydrogen gas to the reflection surface having a flow velocity at the reflection surface variable; a data generation unit configured to generate data reflecting reflectance of the extreme ultraviolet concentrating mirror; and a processor configured to control the first etching gas supply unit to decrease the flow velocity when the data indicates that an amount of decrease in the reflectance is equal to or more than a reference value.

BRIEF DESCRIPTION OF THE DRAWINGS

Embodiments of the present disclosure will be described below merely as examples with reference to the accompanying drawings.

DESCRIPTION OF EMBODIMENTS

Figure 1:
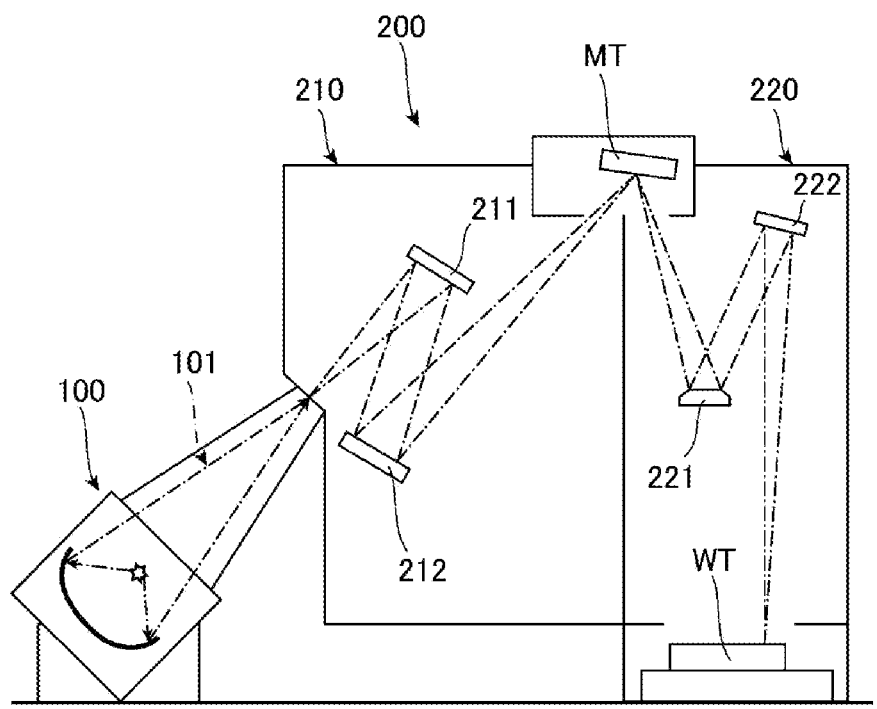
FIG. 1 is a schematic view showing a schematic configuration example of an entire electronic device manufacturing apparatus.

1. Overview
2. Description of electronic device manufacturing apparatus
3. Description of extreme ultraviolet light generation apparatus of comparative example
   3.1 Configuration
   3.2 Operation
   3.3 Problem
4. Description of extreme ultraviolet light generation chamber device of first embodiment
   4.1 Configuration
   4.2 Operation
   4.3 Effect
   4.4 Description of modification
5. Description of extreme ultraviolet light generation chamber device of second embodiment
   5.1 Configuration
   5.2 Operation
   5.3 Effect
6. Description of extreme ultraviolet light generation chamber device of third embodiment
   6.1 Configuration
   6.2 Operation
   6.3 Effect
   6.4 Description of modification
7. Description of extreme ultraviolet light generation chamber device of fourth embodiment
   7.1 Configuration
   7.2 Operation
   7.3 Effect Hereinafter, embodiments of the present disclosure will be described in detail with reference to the drawings. The embodiments described below show some examples of the present disclosure and do not limit the contents of the present disclosure. Also, all configurations and operation described in the embodiments are not necessarily essential as configurations and operation of the present disclosure. Here, the same components are denoted by the same reference numerals, and duplicate description thereof is omitted.

1. Overview

Embodiments of the present disclosure relate to an extreme ultraviolet light generation apparatus generating light having a wavelength of extreme ultraviolet (EUV) and an electronic device manufacturing apparatus. In the following, extreme ultraviolet light is referred to as EUV light in some cases.

2. Description of Electronic Device Manufacturing Apparatus

FIG. 1 is a schematic view showing a schematic configuration example of an entire electronic device manufacturing apparatus. The electronic device manufacturing apparatus shown in FIG. 1 includes an EUV light generation apparatus 100 and an exposure apparatus 200. The exposure apparatus 200 includes a mask irradiation unit 210 including a plurality of mirrors 211, 212 that constitute a reflection optical system, and a workpiece irradiation unit 220 including a plurality of mirrors 221, 222 that constitute a reflection optical system different from the reflection optical system of the mask irradiation unit 210. The mask irradiation unit 210 illuminates, via the mirrors 211, 212, a mask pattern of a mask table MT with EUV light 101 incident from the EUV light generation apparatus 100. The workpiece irradiation unit 220 images the EUV light 101 reflected by the mask table MT onto a workpiece (not shown) arranged on a workpiece table WT via the mirrors 221, 222. The workpiece is a photosensitive substrate such as a semiconductor wafer on which photoresist is applied. The exposure apparatus 200 synchronously translates the mask table MT and the workpiece table WT to expose the workpiece to the EUV light 101 reflecting the mask pattern. Through the exposure process as described above, a device pattern is transferred onto the semiconductor wafer, thereby a semiconductor device can be manufactured.

Figure 2:
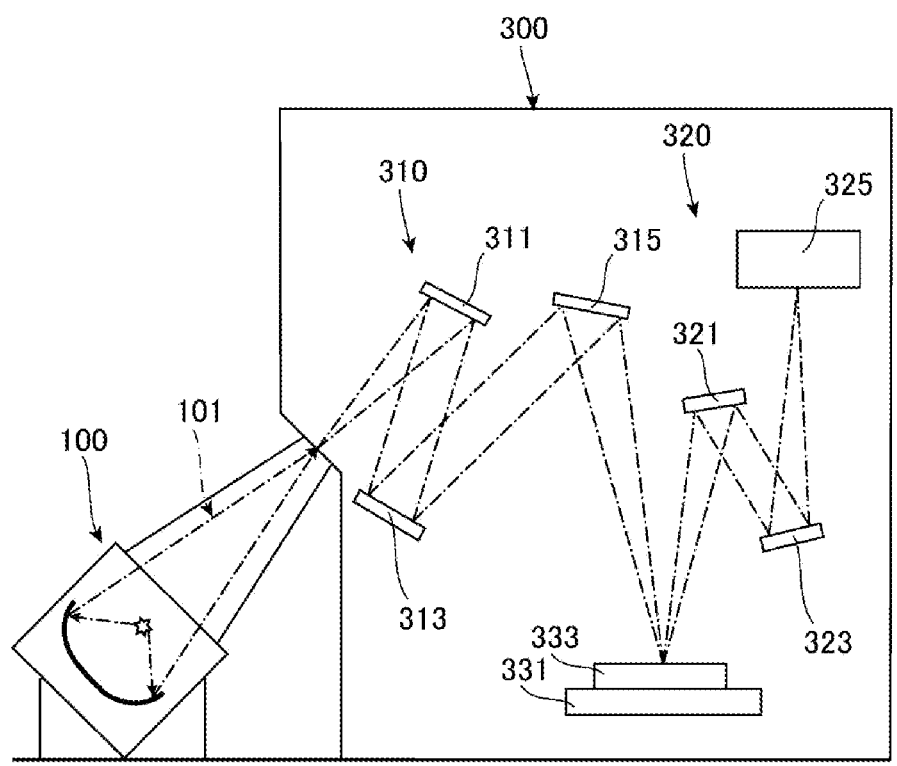
FIG. 2 is a schematic view showing a schematic configuration example of an entire electronic device manufacturing apparatus different from the electronic device manufacturing apparatus shown in FIG. 1.

FIG. 2 is a schematic view showing a schematic configuration example of an entire electronic device manufacturing apparatus different from the electronic device manufacturing apparatus shown in FIG. 1. The electronic device manufacturing apparatus shown in FIG. 2 includes the EUV light generation apparatus 100 and an inspection apparatus 300. The inspection apparatus 300 includes an illumination optical system 310 including a plurality of mirrors 311, 313, 315 that constitute a reflection optical system, and a detection optical system 320 including a detector 325 and a plurality of mirrors 321, 322 that constitute a reflection optical system different from the reflection optical system of the illumination optical system 310. The illumination optical system 310 reflects, with the mirrors 311, 313, 315, the EUV light 101 incident from the EUV light generation apparatus 100 to illuminate a mask 333 placed on a mask stage 331. The mask 333 includes a mask blanks before a pattern is formed. The detection optical system 320 reflects, with the mirrors 321, 323, the EUV light 101 reflecting the pattern from the mask 333 and forms an image on a light receiving surface of the detector 325. The detector 325 having received the EUV light 101 obtains an image of the mask 333. The detector 325 is, for example, a time delay integration (TDI) camera. A defect of the mask 333 is inspected based on the image of the mask 333 obtained by the above-described process, and a mask suitable for manufacturing an electronic device is selected using the inspection result. Then, the electronic device can be manufactured by exposing and transferring the pattern formed on the selected mask onto the photosensitive substrate using the exposure apparatus 200.

3. Description of Extreme Ultraviolet Light Generation Apparatus of Comparative Example

3.1 Configuration

The EUV light generation apparatus 100 of a comparative example will be described. The comparative example of the present disclosure is an example recognized by the applicant as known only by the applicant, and is not a publicly known example admitted by the applicant. Further, the following description will be given with reference to the EUV light generation apparatus 100 that outputs the EUV light 101 to the exposure apparatus 200 as a subsequent process apparatus as shown in FIG. 1. Here, the EUV light generation apparatus 100 that outputs the EUV light 101 to the inspection apparatus 300 as a subsequent process apparatus as shown in FIG. 2 can obtain the same operation and effect.

Figure 3:
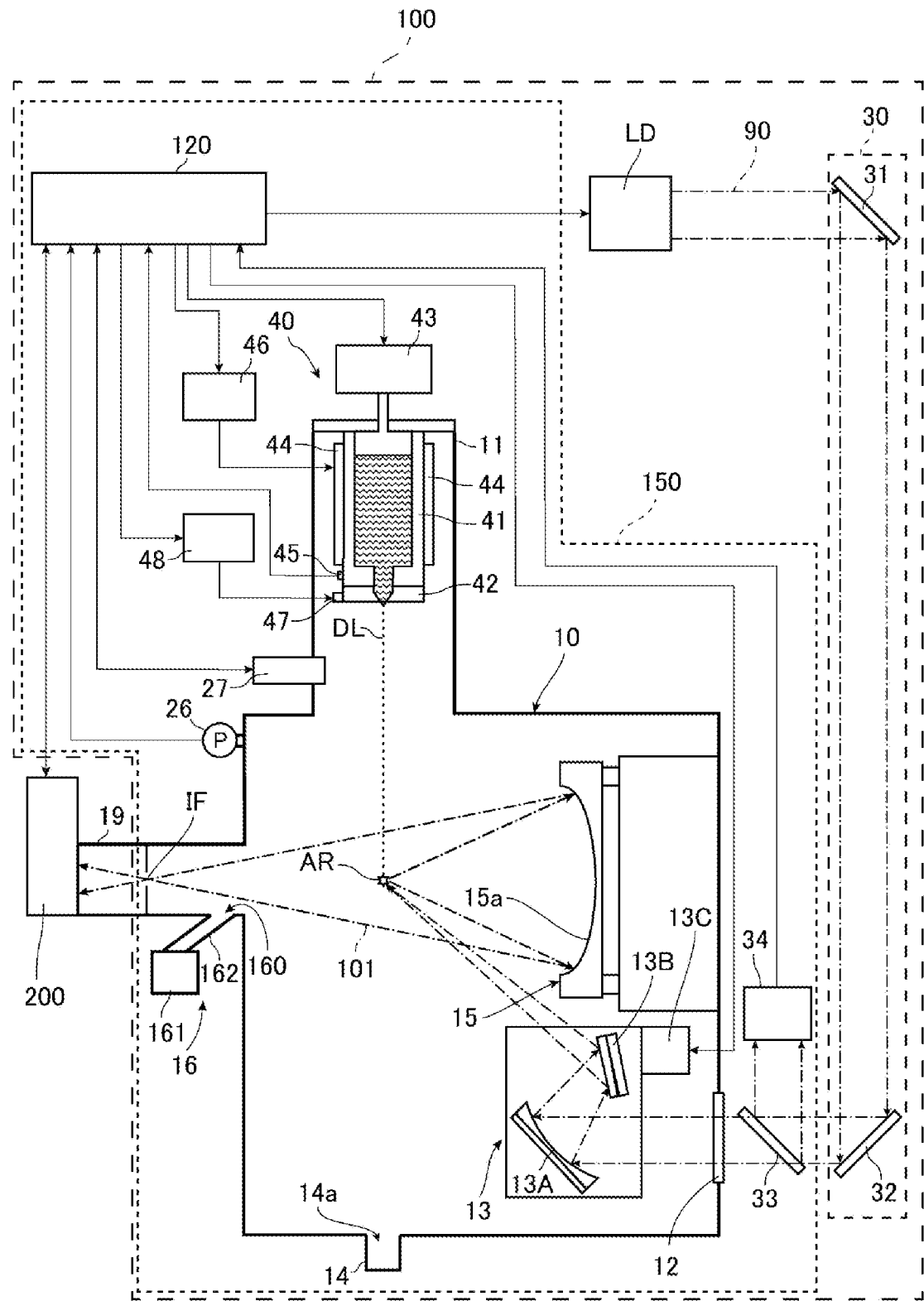
FIG. 3 is a schematic view showing a schematic configuration example of the entire extreme ultraviolet light generation apparatus of a comparative example.

FIG. 3 is a schematic diagram showing a schematic configuration example of the entire EUV light generation apparatus 100 of the present example. As shown in FIG. 3, the EUV light generation apparatus 100 includes an EUV light generation chamber device 150, a laser device LD, and a laser light delivery optical system 30 as a main configuration. The EUV light generation chamber device 150 includes a chamber 10 and a processor 120 as a main configuration.

The chamber 10 is a sealable container. The chamber 10 includes a sub-chamber 11, and a target supply unit 40 is attached to the sub-chamber 11 to penetrate a wall of the sub-chamber 11. The target supply unit 40 includes a tank 41, a nozzle 42, and a pressure regulator 43 to supply a droplet target DL into the internal space of the chamber 10. The droplet target DL is sometimes abbreviated as a droplet or a target.

The tank 41 stores therein a target substance which becomes the droplet target DL. The target substance contains tin. The inside of the tank 41 is in communication with the pressure regulator 43 which adjusts the pressure in the tank 41. A heater 44 and a temperature sensor 45 are attached to the tank 41. The heater 44 heats the tank 41 with current applied from a heater power source 46. Through the heating, the target substance in the tank 41 melts. The temperature sensor 45 measures, via the tank 41, the temperature of the target substance in the tank 41. The pressure regulator 43, the temperature sensor 45, and the heater power source 46 are electrically connected to the processor 120.

The nozzle 42 is attached to the tank 41 and outputs the target substance. A piezoelectric element 47 is attached to the nozzle 42. The piezoelectric element 47 is electrically connected to a piezoelectric power source 48 and is driven by a voltage applied from the piezoelectric power source 48. The piezoelectric power source 48 is electrically connected to the processor 120. The target substance output from the nozzle 42 is formed into the droplet target DL through operation of the piezoelectric element 47.

The chamber 10 includes a target collection unit 14. The target collection unit 14 is a box body attached to the chamber 10 and communicates with the internal space of the chamber 10 via an opening 14a formed at the chamber 10. The opening 14a is arranged directly below the nozzle 42. The target collection unit 14 is a drain tank to collect any unnecessary droplet target DL having passed through the opening 14a and reaching the target collection unit 14.

At least one through hole is formed in the chamber 10. The through hole is blocked by a window 12 through which pulse laser light 90 output from the laser device LD passes.

Further, a laser light concentrating optical system 13 is arranged at the internal space of the chamber 10. The laser light concentrating optical system 13 includes a laser light concentrating mirror 13A and a high reflection mirror 13B. The laser light concentrating mirror 13A reflects and concentrates the laser light 90 having passed through the window 12. The high reflection mirror 13B reflects the laser light 90 concentrated by the laser light concentrating mirror 13A. Positions of the laser light concentrating mirror 13A and the high reflection mirror 13B are adjusted by a laser light manipulator 13C so that a concentration position of the laser light 90 at the internal space of the chamber 10 coincides with a position specified by the processor 120. The light concentration position is adjusted to be a position directly below the nozzle 42, and when the target substance is irradiated with the laser light 90 at the light concentration position, plasma is generated from the target substance, and the EUV light 101 is radiated from the plasma. The region in which plasma is generated is sometimes referred to as a plasma generation region AR. The plasma generation region AR is a region having a radius of, for example, 40 mm about a plasma point and is located at the internal space of the chamber 10.

For example, an EUV light concentrating mirror 15 having a spheroidal reflection surface 15a is arranged at the internal space of the chamber 10. The EUV light concentrating mirror 15 includes, for example, a multilayer film in which silicon layers and molybdenum layers are alternately laminated, and reflects the EUV light 101 by the multilayer film. The EUV light concentrating mirror 15 is provided at a position not overlapping with the laser light 90 at the internal space of the chamber 10. The reflection surface 15a reflects the EUV light 101 radiated from the plasma in the plasma generation region AR. The reflection surface 15a has a first focal point and a second focal point. The reflection surface 15a may be arranged such that, for example, the first focal point is located in the plasma generation region AR and the second focal point is located at an intermediate focal point IF.

The EUV light generation apparatus 100 includes a connection portion 19 providing communication between the internal space of the chamber 10 and the internal space of the exposure apparatus 200. A wall in which an aperture is formed is arranged in the connection portion 19. The wall is preferably arranged such that the aperture is located at the second focal point. The connection portion 19 is an outlet port of the EUV light 101 in the chamber 10, and the EUV light 101 is output from the connection portion 19 and enters the exposure apparatus 200.

A first etching gas supply unit 16 is connected to the chamber 10. The first etching gas supply unit 16 includes a first gas supply port 160. As will be described later, an etching gas contains a hydrogen gas, and the etching gas of the present example is a hydrogen gas having a hydrogen concentration of 100% in effect. Therefore, in the present example, the first etching gas supply unit 16 further includes a hydrogen tank 161 and a gas pipe 162. The first etching gas supply unit 16 supplies the hydrogen gas in the hydrogen tank 161 to the reflection surface 15a of the EUV light concentrating mirror 15 from the first gas supply port 160 via the gas pipe 162.

Further, the EUV light generation apparatus 100 includes a pressure sensor 26 and a detection unit 27 as a target sensor. The pressure sensor 26 and the detection unit 27 are attached to the chamber 10 and are electrically connected to the processor 120. The pressure sensor 26 measures the pressure at the internal space of the chamber 10 and outputs a signal indicating the pressure to the processor 120.

The detection unit 27 has, for example, an imaging function, and detects the presence, trajectory, position, velocity, and the like of the droplet target DL output from the nozzle hole of the nozzle 42 in accordance with an instruction from the processor 120. The detection unit 27 may be arranged inside the chamber 10, or may be arranged outside the chamber 10 and detect the droplet target DL through a window (not shown) arranged on a wall of the chamber 10. The detection unit 27 includes a light receiving optical system (not shown) and an imaging unit (not shown) such as a charge-coupled device (CCD) or a photodiode. In order to improve the detection accuracy of the droplet target DL, the light receiving optical system forms an image of the trajectory of the droplet target DL and the periphery thereof on a light receiving surface of the imaging unit. When the droplet target DL passes through a light concentration region of a light source (not shown) arranged to improve contrast in the field of view of the detection unit 27, the imaging unit detects a change of the light passing through the trajectory of the droplet target DL and the periphery thereof. The imaging unit converts the detected light change into a signal related to the image data of the droplet target DL. The imaging unit outputs the electric signal to the processor 120.

The laser device LD includes a master oscillator being a light source to perform burst operation. The master oscillator outputs the pulse laser light 90 in a burst-on duration. The master oscillator is, for example, a solid-state laser device that excites a YAG crystal to which niobium (Nb) or ytterbium (Yb) is added, or a laser device that outputs the laser light 90 by exciting a gas in which helium, nitrogen, or the like is mixed in a carbon dioxide gas through discharge. Alternatively, the master oscillator may be a quantum cascade laser device. The master oscillator may output the pulse laser light 90 by a Q switch system. Further, the master oscillator may include an optical switch, a polarizer, and the like. In the burst operation, the pulse laser light 90 is continuously output at a predetermined repetition frequency in the burst-on duration and the output of the laser light 90 is stopped in a burst-off duration. The laser device LD may include an amplifier that amplifies the laser light output from the master oscillator.

A travel direction of the laser light 90 output from the laser device LD is adjusted by the laser light delivery optical system 30. The laser light delivery optical system 30 includes a plurality of mirrors 31, 32 for adjusting the travel direction of the laser light 90. The position of at least one of the mirrors 31, 32 is adjusted by an actuator (not shown). Owing to that the position of at least one of the mirrors 31, 32 is adjusted, the laser light 90 can appropriately propagate to the internal space of the chamber 10 through the window 12.

Between the mirror 32 and the window 12, a beam splitter 33 is provided. The beam splitter 33 transmits most of the laser light 90 reflected by the mirror 32 and reflects a part of the laser light 90. A laser light measurement instrument 34 is provided in the travel direction of the laser light 90 reflected by the beam splitter 33. The laser light measurement instrument 34 includes a light receiving element, measures the power of the received laser light 90, and outputs a signal related to the power of the laser light 90. The laser light measurement instrument 34 is electrically connected to the processor 120, and a signal related to the power of the laser light 90 is input to the processor 120.

The processor 120 of the present disclosure is a processing device including a storage device in which a control program is stored and a central processing unit (CPU) that executes the control program. The processor 120 is specifically configured or programmed to perform various processes included in the present disclosure and controls the entire EUV light generation apparatus 100. The processor 120 receives a signal related to the pressure at the internal space of the chamber 10, which is measured by the pressure sensor 26, a signal related to image data of the droplet target DL captured by the detection unit 27, a burst signal instructing the burst operation from the exposure apparatus 200, and the like. The processor 120 processes the various signals, and may control, for example, the timing at which the droplet target DL is output, the output direction of the droplet target DL, and the like. Further, the processor 120 may control the output timing of the laser device LD, the travel direction and the concentration position of the laser light 90, and the like. Such various kinds of control described above are merely exemplary, and other control may be added as necessary, as described later.

Figure 4:
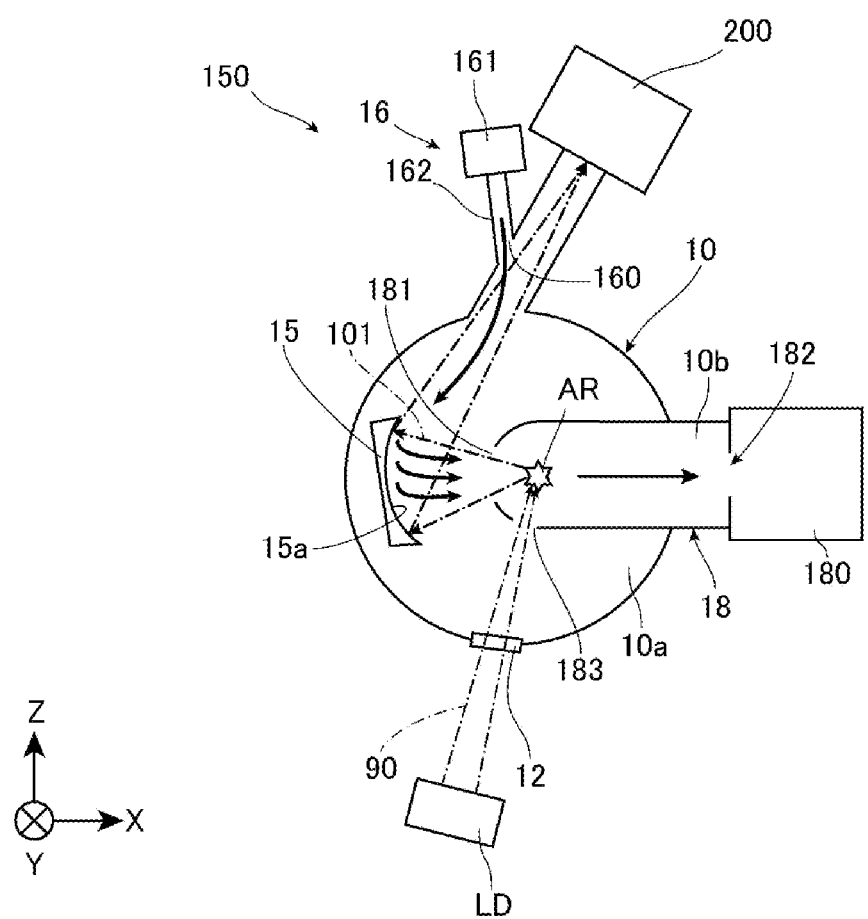
FIG. 4 is a schematic diagram showing an extreme ultraviolet light generation chamber device in a cross section perpendicular to a trajectory of a droplet target in the comparative example.
Figure 5:
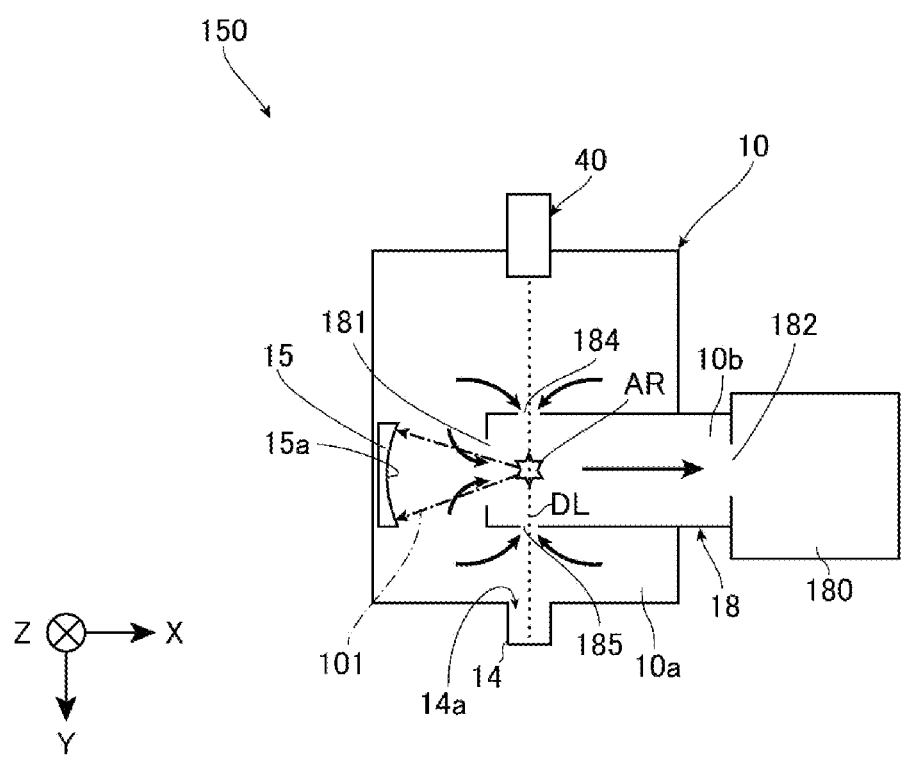
FIG. 5 is a schematic diagram showing the extreme ultraviolet light generation chamber device in a cross section perpendicular to the trajectory of the droplet target in the comparative example.

FIG. 4 is a schematic diagram including a cross section of the chamber 10 perpendicular to the trajectory of the droplet target DL in the comparative example, and FIG. 5 is a schematic diagram including a cross section of the chamber 10 along the trajectory of the droplet target DL. In FIG. 4, for simplification of illustration, the laser light concentrating mirror 13A and the high reflection mirror 13B are omitted, and a travel path of the laser light 90 from the window 12 to the plasma generation region AR is shown in a simple manner.

The EUV light generation apparatus 100 includes a cylindrical partition wall 18 arranged at the internal space of the chamber 10. In FIGS. 4 and 5, a space outside the partition wall 18 at the internal space of the chamber 10 is indicated as a first space 10a, and a space inside the partition wall 18 is indicated as a second space 10b. In FIG. 3, the partition wall 18 is not shown.

The partition wall 18 is made of, for example, stainless steel, metal molybdenum, or the like. The partition wall 18 surrounds the plasma generation region AR. That is, the plasma generation region AR is located in the second space 10b. The partition wall 18 extends linearly from the internal space of the chamber 10 to the external space of the chamber 10. A first opening 181 is provided at one end of the partition wall 18 located at the internal space of the chamber 10, and a gas exhaust port 182 is provided at the other end of partition wall 18 located outside the chamber 10.

The EUV light 101 generated from the plasma in the plasma generation region AR is incident on the EUV light concentrating mirror 15 arranged in the first space 10a from the second space 10b through the first opening 181. The EUV light concentrating mirror 15 reflects the EUV light 101 toward the intermediate focal point IF located in a direction different from the incident direction of the EUV light 101.

The first opening 181 faces the gas exhaust port 182, and the plasma generation region AR is located between the first opening 181 and the gas exhaust port 182. The gas exhaust port 182 is connected to an exhaust device 180 including an exhaust pump. In the present example, the area of the gas exhaust port 182 is larger than the area of the first opening 181.

Further, the partition wall 18 includes a second opening 183, a droplet supply opening 184, and a droplet discharge opening 185 formed on the side surface of the partition wall 18. The second opening 183 is provided on the optical path of the laser light 90 toward the plasma generation region AR in the internal space of the chamber 10, and the laser light 90 enters the plasma generation region AR from the first space 10a through the second opening 183. The droplet supply opening 184 and the droplet discharge opening 185 are provided on the trajectory of the droplet target DL and face each other. The droplet target DL is supplied from the target supply unit 40 to the plasma generation region AR through the droplet supply opening 184. The droplet discharge opening 185 faces the opening 14a connected to the target collection unit 14, and the droplet target DL that has passed through the plasma generation region AR enters the target collection unit 14 through the droplet discharge opening 185. In the present example, the areas of the droplet supply opening 184 and the droplet discharge opening 185 are substantially the same as each other and are larger than the area of the second opening 183. The partition wall 18 surrounds the plasma generation region AR except on the trajectory of the droplet target DL at the internal space of the chamber 10 and on the optical path of the laser light 90 to the plasma generation region AR at the internal space.

Since the target substance is tin as described above, tin fine particles and tin charged particles are generated when the target substance is turned into plasma in the plasma generation region AR by being irradiated with the laser light 90. Further, hydrogen contained in the etching gas supplied from the first etching gas supply unit 16 to the internal space of the chamber 10 becomes hydrogen radicals due to the energy of the EUV light 101. Tin constituting the fine particles and the charged particles reacts with hydrogen radicals. When tin reacts with hydrogen radicals, stannane ($SnH_4$) gas at room temperature is generated. Here, the etching gas includes a hydrogen gas, and is, for example, a gas having a hydrogen gas concentration of 100% in effect, but may be, for example, a balance gas having a hydrogen gas concentration of about 3%. In this case, the balance gas includes, for example, a nitrogen ($N_2$) gas or an argon (Ar) gas. In FIG. 4 and FIG. 5, the flow of the etching gas supplied from the first etching gas supply unit 16 to the reflection surface 15a of the EUV light concentrating mirror 15 is indicated by arrows. The flow rate of the etching gas supplied from the first etching gas supply unit 16 to the first space 10a is, for example, 10 l/min or more and 100 l/min or less. Here, the flow rate of the etching gas may be represented by nlm which represents the volume of the etching gas flowing per minute converted to that at 0° C. and 1 atm. The area of the first opening 181 is larger than the area of each of the second opening 183, the droplet supply opening 184, and the droplet discharge opening 185. Therefore, the etching gas having supplied into the first space 10a and flowed to the reflection surface 15a mainly flows into the second space 10b through the first opening 181. However, the etching gas may also flow into the second space 10b through the second opening 183, the droplet supply opening 184, and the droplet discharge opening 185.

When the target substance is turned into plasma in the plasma generation region AR, the residual gas as an exhaust gas is generated in the second space 10b. The residual gas contains tin fine particles and charged particles generated through the plasma generation from the target substance, stannane generated through the reaction of the tin fine particles and charged particles with the etching gas, and an unreacted etching gas. Some of the charged particles are neutralized in the second space 10b, and the residual gas contains the neutralized charged particles as well. The gas exhaust port 182 exhausts the etching gas having flowed from the first space 10a to the second space 10b together with the residual gas to the outside of the chamber 10. Specifically, the gas exhaust port 182 exhausts the etching gas and the residual gas to the exhaust device 180 by suction of the exhaust device 180.

In the following, a direction along the trajectory of the droplet target DL may be referred to as a Y direction, a direction from the plasma generation region AR toward the exhaust device 180 and perpendicular to the Y direction may be referred to as an X direction, and a direction perpendicular to the Y direction and the X direction may be referred to as a Z direction.

3.2 Operation

Next, operation of the EUV light generation apparatus 100 of the comparative example will be described.

In the EUV light generation apparatus 100, for example, at the time of new installation or maintenance or the like, atmospheric air at the internal space of the chamber 10 is exhausted. At this time, purging and exhausting of the internal space of the chamber 10 may be repeated for exhausting atmospheric components. For example, an inert gas such as nitrogen or argon is preferably used for the purge gas. Thereafter, when the pressure at the internal space of the chamber 10 becomes equal to or lower than a predetermined pressure, the processor 120 starts introducing the etching gas into the first space 10a of the chamber 10 through the first gas supply port 160 of the first etching gas supply unit 16. The etching gas is supplied toward the reflection surface 15a of the EUV light concentrating mirror 15. At this time, the processor 120 may control a supply gas flow rate adjusting unit (not shown) and the exhaust device 180 so that the pressure at the internal space of the chamber 10 is maintained at the predetermined pressure. Thereafter, the processor 120 waits until a predetermined time elapses from the start of introduction of the etching gas.

Further, the processor 120 causes the gas at the internal space of the chamber 10 to be exhausted from the gas exhaust port 182 by the exhaust device 180, and maintains the pressure at the internal space of the chamber 10 substantially constant based on the signal indicating the pressure at the internal space of chamber 10 measured by the pressure sensor 26.

In order to heat and maintain the target substance in the tank 41 to and at a predetermined temperature equal to or higher than the melting point, the processor 120 causes the heater power source 46 to supply current to the heater 44 to increase temperature of the heater 44. In this case, the processor 120 controls the temperature of the target substance to the predetermined temperature by adjusting a value of the current supplied from the heater power source 46 to the heater 44 based on an output from the temperature sensor 45. When the target substance is tin, the predetermined temperature is equal to or higher than 231.93° C. being the melting point of tin and, for example, is 240° C. or higher and 290° C. or lower. Thus, the preparation for outputting the droplet target DL is completed.

When the preparation is completed, the processor 120 causes the pressure regulator 43 to supply the inert gas from the gas supply source into the tank 41 and to adjust the pressure in the tank 41 so that the melted target substance is output through the nozzle hole of the nozzle 42 at a predetermined velocity. Under this pressure, the target substance is output into the first space 10a of the chamber 10 through the nozzle hole of the nozzle 42. The target substance output through the nozzle hole may be in the form of a jet. At this time, the processor 120 causes the piezoelectric power source 48 to apply voltage having a predetermined waveform to the piezoelectric element 47 to generate the droplet target DL. The piezoelectric power source 48 applies voltage so that the waveform of the voltage value becomes, for example, a sine wave, a rectangular wave, or a sawtooth wave. Vibration of the piezoelectric element 47 can propagate through the nozzle 42 to the target substance to be output through the nozzle hole of the nozzle 42. The target substance is divided at a predetermined cycle by the vibration into liquid droplet targets DL. The diameter of the droplet target DL is approximately 10 µm or more and 30 µm or less.

When the droplet target DL is discharged, the droplet target DL passes through the droplet supply opening 184 and travels to the plasma generation region AR. The detection unit 27 detects the passage timing of the droplet target DL passing through a predetermined position in the second space 10b of the chamber 10. The processor 120 outputs a trigger signal to control the timing of outputting the laser light 90 from the laser device LD based on the signal from the detection unit 27 so that the droplet target DL is irradiated with the laser light 90. The trigger signal output from the processor 120 is input to the laser device LD. When the trigger signal is input, the laser device LD outputs the pulse laser light 90.

The output laser light 90 enters the laser light concentrating optical system 13 through the laser light delivery optical system 30 and the window 12. At this time, the laser light 90 reflected by the beam splitter 33 is received by the laser light measurement instrument 34, and the power thereof is measured. The laser light measurement instrument 34 outputs a signal related to the measured power of the laser light 90 to the processor 120. The processor 120 controls the laser device LD based on the signal input from the laser light measurement instrument 34, so that the laser device LD outputs the laser light 90 having a desired power.

The laser light 90 travels from the laser light concentrating optical system 13 toward the plasma generation region AR through the second opening 183. Then, the droplet target DL is irradiated with the laser light 90 in the plasma generation region AR. At this time, the processor 120 controls the laser light manipulator 13C of the laser light concentrating optical system 13 so that the laser light 90 is concentrated in the plasma generation region AR. The processor 120 controls the timing of outputting the laser light 90 from the laser device LD based on the signal from the detection unit 27 so that the droplet target DL is irradiated with the laser light 90. Thus, the droplet target DL is irradiated in the plasma generation region AR with the laser light 90 concentrated by the laser light concentrating mirror 13A. Plasma is generated by the irradiation, and light including the EUV light 101 is radiated from the plasma.

Among the light including the EUV light 101 generated in the plasma generation region AR, the EUV light 101 travels to the EUV light concentrating mirror 15 after passing through the first opening 181, is concentrated at the intermediate focal point IF by the EUV light concentrating mirror 15, and then, enters the exposure apparatus 200 from the connection portion 19.

As described above, the first etching gas supply unit 16 supplies the etching gas to the first space 10a of the chamber 10 through the first gas supply port 160. The etching gas is supplied to the reflection surface 15a of the EUV light concentrating mirror 15. At this time, hydrogen contained in the etching gas is turned into hydrogen radicals due to the energy of the EUV light 101. Therefore, when tin is deposited on the reflection surface 15a, the tin reacts with hydrogen radicals to become stannane and is removed from the reflection surface 15a. The etching gas and the stannane flow along the reflection surface 15a, and then flow into the second space 10b mainly from the first opening 181. The exhaust device 180 suctions the etching gas together with the residual gas in the second space 10b through the gas exhaust port 182. Accordingly, the gas in the second space 10b is exhausted to the outside of the chamber 10. The gas suctioned by the exhaust device 180 is subjected to predetermined exhaust treatment such as detoxification.

3.3 Problem

When tin adheres to the reflection surface 15a, reflectance of the EUV light 101 decreases, and there is a fear that the power of the EUV light 101 output from the EUV light generation apparatus 100 decreases. In order to effectively remove tin from the reflection surface 15a, the density of hydrogen radicals of the reflection surface 15a may be increased. In order to increase the density of hydrogen radicals, it is conceivable to cause the etching gas to stay on the reflection surface 15a and to lengthen the duration of the irradiation with EUV light. However, if a state in which the density of hydrogen radicals is high continues for a long time, hydrogen radicals may enter the inside of the multilayer film of the reflection surface 15a, which may increase the risk of occurrence of hydrogen blistering. Hydrogen blistering is not preferable because it destroys the multilayer film structure and causes decrease of the reflectance thereof. As described above, when tin is to be effectively removed from the reflection surface 15a, there arises a problem that hydrogen blistering may occur.

Therefore, the following embodiments exemplify an EUV light generation chamber device 150 which can suppress decrease in the power of the EUV light 101 output from the EUV light generation apparatus 100 by achieving both efficient etching and suppression of blistering.

4. Description of Extreme Ultraviolet Light Generation Chamber Device of First Embodiment The configuration of the EUV light generation chamber device 150 of a first embodiment will be described. Any component same as that described above is denoted by an identical reference sign, and duplicate description thereof is omitted unless specific description is needed.

4.1 Configuration

Figure 6:
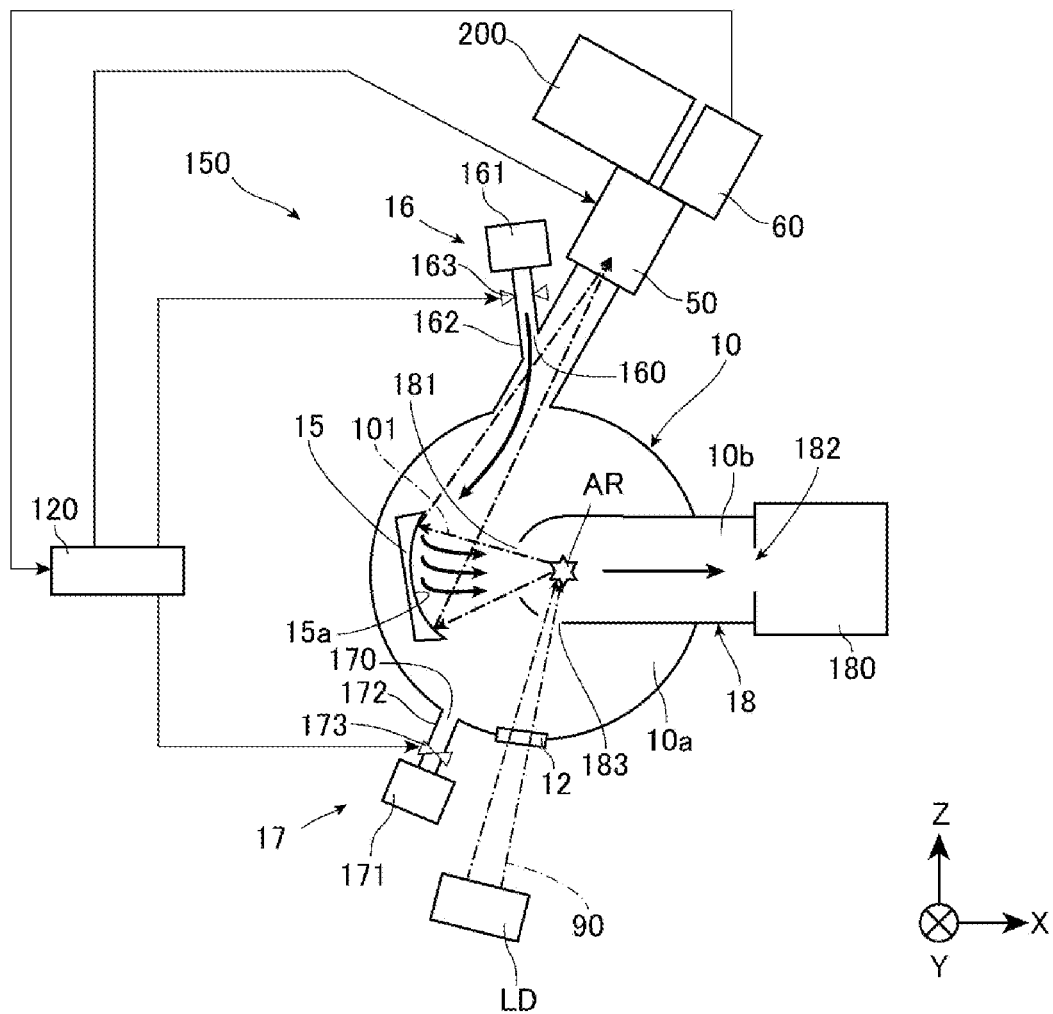
FIG. 6 is a schematic diagram of the extreme ultraviolet light generation chamber device of a first embodiment shown in the same manner as FIG. 4.

FIG. 6 is a schematic diagram of the EUV light generation chamber device 150 of the present embodiment shown in the same manner as FIG. 4. The EUV light generation chamber device 150 of the present embodiment mainly differs from the EUV light generation chamber device 150 of the comparative embodiment in including an optical path switching mechanism 50, an EUV light measurement instrument 60, and a second etching gas supply unit 17.

Further, the first etching gas supply unit 16 of the present embodiment includes a first valve 163. Therefore, in the present embodiment, the first etching gas supply unit 16 can supply the etching gas at a variable flow velocity by changing the opening degree of the first valve 163. Therefore, the first etching gas supply unit 16 can supply the etching gas to the reflection surface 15*a* of the EUV light concentrating mirror 15 at a variable flow velocity. Making the flow velocity variable includes setting the flow velocity to zero, that is, stopping the supply of the etching gas. The first valve 163 is electrically connected to the processor 120. Therefore, the processor 120 may control the opening degree of the first valve 163. That is, the processor 120 may control the first etching gas supply unit 16 to change the flow velocity of the supplied etching gas.

The second etching gas supply unit 17 is connected to the chamber 10. In the present embodiment, the second etching gas supply unit 17 includes a second gas supply port 170. In the present example, the second gas supply port 170 is substantially opposed to the first gas supply port 160 via a region between the EUV light concentrating mirror 15 and the first opening 181 of the partition wall 18. The second etching gas supply unit 17 supplies the etching gas to the first space 10*a*. The etching gas supplied from the second etching gas supply unit 17 is less likely to flow to the reflection surface 15*a* than the etching gas supplied from the first etching gas supply unit 16. The second etching gas supply unit 17 supplies an etching gas containing the same gas as the etching gas supplied by the first etching gas supply unit 16. However, the second etching gas supply unit 17 may supply an etching gas different from the etching gas supplied by the first etching gas supply unit 16 as long as the etching gas containing hydrogen gas is supplied. In the present example, the second etching gas supply unit 17 includes a hydrogen tank 171, a gas pipe 172, and a second valve 173. Therefore, the second etching gas supply unit 17 can supply the etching gas at a variable flow velocity by changing the opening degree of the second valve 173. The second valve 173 is electrically connected to the processor 120. Accordingly, the processor 120 may control the opening degree of the second valve 173. That is, the processor 120 may control the second etching gas supply unit 17 to change the flow velocity of the supplied etching gas. The etching gas supplied from the second etching gas supply unit 17 flows from the first space 10*a* to the second space 10*b* mainly through the first opening 181.

Figure 7:
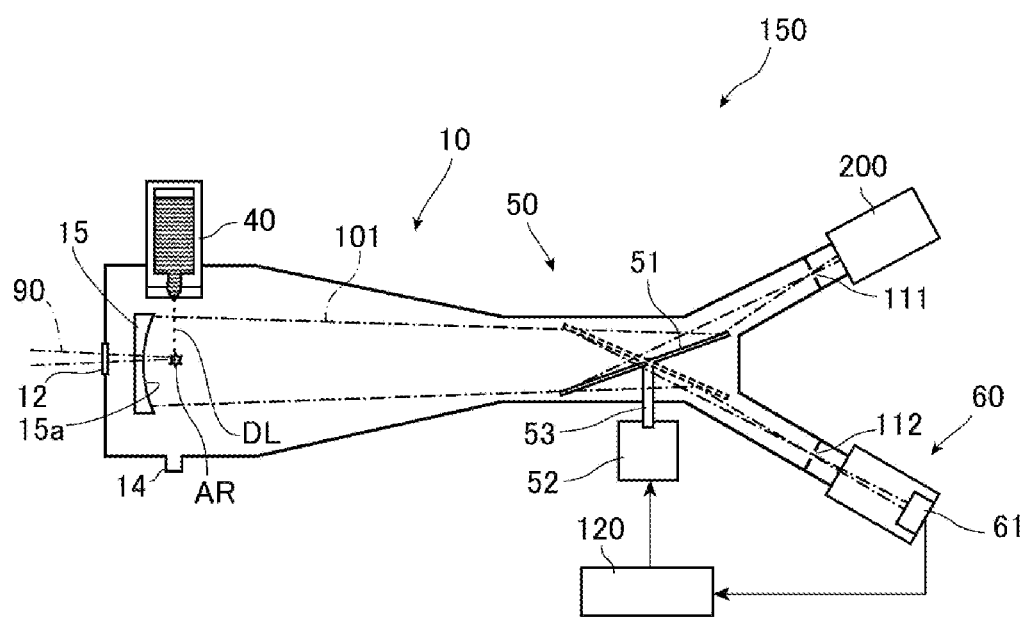
FIG. 7 is a schematic diagram showing a state of a chamber including an optical path switching mechanism of FIG. 6.

FIG. 7 is a schematic diagram showing a state of the chamber 10 including the optical path switching mechanism 50 of FIG. 6. As shown in FIG. 7, in the present embodiment, the chamber 10 includes a first emission port 111 and a second emission port 112 for outputting the EUV light 101 reflected by the EUV light concentrating mirror 15. The first emission port 111 and the second emission port 112 preferably are apertures provided at the intermediate focal point IF of the EUV light 101. The first emission port 111 is connected to the connection portion 19 as in the comparative example, and the exposure apparatus 200 is connected to the connection portion 19. Here, the subsequent process apparatus may be the inspection apparatus 300. The second emission port 112 is connected to the EUV light measurement instrument 60.

The optical path switching mechanism 50 includes an optical path switching mirror 51, an actuator 52, and a rotation shaft 53. The optical path switching mirror 51 includes, for example, a multilayer film similar to that of the EUV light concentrating mirror 15, is arranged on the optical path of the EUV light 101 reflected by the EUV light concentrating mirror 15, and reflects the EUV light 101. In the present example, the optical path switching mirror 51 is provided with the above-described multilayer film on both surfaces, and both the surfaces are reflection surfaces. The rotation shaft 53 is connected to the optical path switching mirror 51 and the actuator 52. Here, the rotation direction may be changed via a gear structure (not shown). The actuator 52 rotates the rotation shaft 53. Accordingly, the actuator 52 can rotate the optical path switching mirror 51. The actuator 52 is electrically connected to the processor 120, and the processor 120 controls the actuator 52. Therefore, the processor 120 can control the angle of the optical path switching mirror 51 by controlling the actuator 52.

The optical path switching mirror 51 is switched between a first state in which the EUV light 101 reflected by the EUV light concentrating mirror 15 is reflected to the first emission port 111 and a second state in which the EUV light 101 is reflected to the second emission port 112 by being angularly controlled by the processor 120. Therefore, the EUV light 101 is output from the first emission port 111 to the exposure apparatus 200 in the first state, and is output from the second emission port 112 to the EUV light measurement instrument 60 in the second state. The optical path switching mirror 51 reflects the EUV light 101 by the reflection surface on one side in the first state, and reflects the EUV light 101 by the reflection surface on the other side thereof in the second state. In FIG. 7, the optical path switching mirror 51 in the first state is indicated by a solid line, and the optical path switching mirror 51 in the second state is indicated by a broken line.

The EUV light measurement instrument 60 measures the power of EUV light 101. The EUV light measurement instrument 60 includes an EUV sensor 61 that receives the EUV light 101. The EUV sensor 61 includes a light receiving element that receives the EUV light 101, and outputs data related to the power of the EUV light 101 received by the light receiving element. The EUV light measurement instrument 60 is electrically connected to the processor 120, and the data output from the EUV light measurement instrument 60 is input to the processor 120. Therefore, the processor 120 can detect the power of the EUV light 101 reflected by the EUV light concentrating mirror 15.

When the reflectance of the EUV light concentrating mirror 15 decreases, the power of the EUV light 101 measured by the EUV light measurement instrument 60 also decreases. Therefore, the data related to the power of the EUV light 101 measured by the EUV light measurement instrument 60 is data reflecting the reflectance of the EUV light concentrating mirror 15. Therefore, in the present embodiment, the EUV light measurement instrument 60 is a data generation unit that generates data reflecting the reflectance of the EUV light concentrating mirror 15.

4.2 Operation

Figure 8:
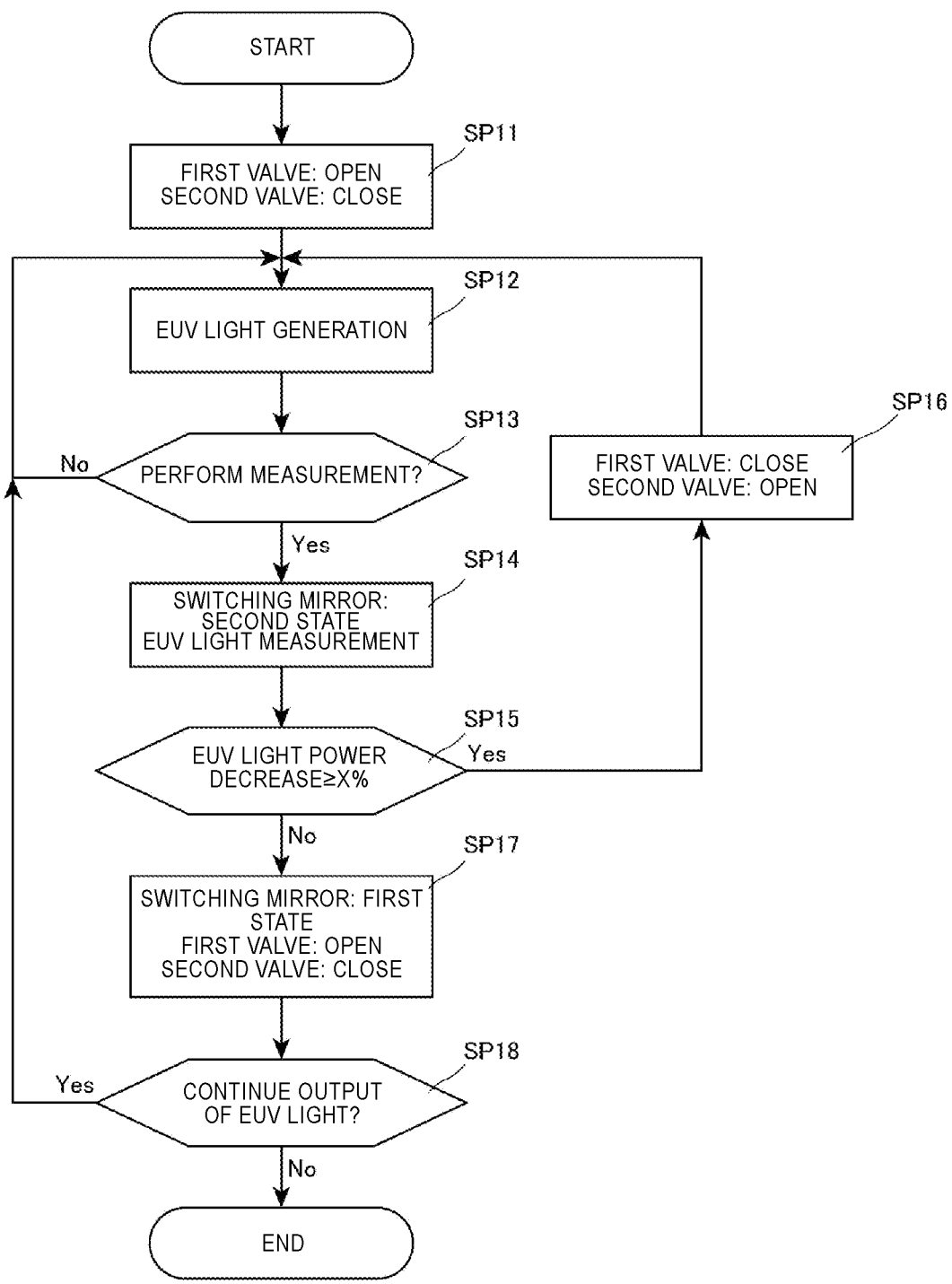
FIG. 8 is a diagram showing an example of a control flowchart of a processor according to the first embodiment.

FIG. 8 is a diagram showing an example of a control flowchart of the processor 120 according to the present embodiment. This control flow includes steps SP11 to SP18.

In the start state shown in FIG. 8, data related to the power of the EUV light 101 measured by the EUV light measurement instrument 60 immediately after the EUV light generation chamber device 150 is replaced is stored in an internal memory of the processor 120. Specifically, immediately after the EUV light generation chamber device 150 is replaced, the processor 120 sets the optical path switching mirror 51 to the second state and controls the laser device LD, the target supply unit 40, and the like so that the EUV light 101 is generated. Accordingly, the generated EUV light 101 is reflected by the EUV light concentrating mirror 15 and the optical path switching mirror 51, and is output from the second emission port 112 to the EUV light measurement instrument 60. The EUV light 101 entering the EUV light measurement instrument 60 is received by the EUV sensor 61. The EUV sensor 61 receives the EUV light 101 and outputs the data related to the power of the received EUV light 101. The data is input to the processor 120. The processor 120 stores the data in the internal memory. Thus, the data related to the power of the EUV light 101 measured by the EUV light measurement instrument 60 immediately after the EUV light generation chamber device 150 is replaced is stored in the memory of the processor 120. The data related to the power of the EUV light 101 may be obtained in advance by an experiment or the like and stored in the memory of the processor 120.

In the start state shown in FIG. 8, the processor 120 sets the optical path switching mirror 51 to the first state. Further, the processor 120 controls the laser device LD, the target supply unit 40, and the like so that the EUV light 101 is generated.

(Step SP11)

The present step is a step of supplying the etching gas to the reflection surface 15a of the EUV light concentrating mirror 15 at a predetermined flow velocity. In the present step, the processor 120 controls the first etching gas supply unit 16 and sets the first valve 163 to an open state. At this time, the flow rate of the etching gas supplied from the first etching gas supply unit 16 is, for example, 25 l/min. The processor 120 also controls the second etching gas supply unit 17 and sets the second valve 173 to a closed state. Therefore, the etching gas is supplied from the first etching gas supply unit 16 to the reflection surface 15a of EUV light concentrating mirror 15 at a predetermined flow velocity. The etching gas flows from the first space 10a into the plasma generation region AR through the first opening 181 and is exhausted by the exhaust device 180. When the first valve 163 is in the open state, the second valve 173 is in the closed state, and the etching gas is supplied to the reflection surface 15a at the predetermined flow velocity in the start state, the processor 120 maintains the state.

(Step SP12)

The present step is a step of generating the EUV light 101. In the present step, the processor 120 controls the laser device LD, the target supply unit 40, and the like to generate the EUV light 101. The generated EUV light 101 is reflected by the reflection surface 15a of the EUV light concentrating mirror 15. When the EUV light 101 has already been generated at the start of the present step, the processor 120 continues the generation of the EUV light 101.

(Step SP13)

The present step is a step of determining whether or not to measure whether or not tin is adhering to the reflection surface 15a of the EUV light concentrating mirror 15. The measurement is determined to be performed, for example, immediately after the EUV light generation apparatus 100 is started up, before the EUV light generation apparatus 100 is shut down, or when the EUV light generation apparatus 100 is in a standby state. When EUV light is being generated and output, measurement is not performed. The processor 120 proceeds to step SP14 when the measurement is to be performed, and returns to step SP12 to continue the generation of the EUV light 101 when the measurement is not to be performed.

(Step SP14)

The present step is a step of measuring the power of the EUV light 101 reflected by the EUV light concentrating mirror 15. The processor 120 controls the actuator 52 so that the optical path switching mirror 51 is set to the second state. When the optical path switching mirror 51 is already in the second state in the present step, the processor 120 maintains the state. Accordingly, in the present step, the generated EUV light 101 is reflected by the EUV light concentrating mirror 15 and the optical path switching mirror 51, and is output to the EUV light measurement instrument 60. The EUV light 101 entering the EUV light measurement instrument 60 is received by the EUV sensor 61. The EUV sensor 61 receives the EUV light 101 and outputs the data related to the power of the received EUV light 101. The output data is input to the processor 120. The processor 120 controls the actuator 52 so that the optical path switching mirror 51 is set to the second state upon receiving the data.

(Step SP15)

The present step is a step of determining whether the power of the EUV light 101 measured by the EUV light measurement instrument 60 has decreased by a predetermined value or more. In the present step, the processor 120 compares the power of the EUV light 101 measured by the EUV light measurement instrument 60 immediately after the EUV light generation chamber device 150 is replaced with the power of the EUV light 101 measured by the EUV light measurement instrument 60 in step SP14 using the data stored in the internal memory. Then, when the data input to the processor 120 in step SP14 indicates that the power of the EUV light 101 has decreased by the predetermined value or more, the processor 120 proceeds to step SP16. On the other hand, when the data does not indicate that the power of the EUV light 101 has decreased by the predetermined value or more, the processor 120 proceeds to step SP17. Here, the predetermined value is a value obtained by dividing the difference between the power of the EUV light 101 immediately after the EUV light generation chamber device 150 is replaced and the power of the EUV light 101 in step SP14 by the power immediately after the EUV light generation chamber device 150 is replaced, and is expressed as a percentage. Assuming that the predetermined value is X %, X % is any value in the range of, for example, 0.1% or more and 10% or less.

When the reflectance of the EUV light concentrating mirror 15 decreases, the power of the EUV light 101 entering the EUV light measurement instrument 60 also decreases. Therefore, when the data input to the processor 120 in step SP14 indicates that the power of the EUV light 101 has decreased by the predetermined value or more, the data indicates that the amount of decrease in the reflectance of the EUV light concentrating mirror 15 is equal to or more than a reference value. This reference value is any value in which the area of the reflection surface 15a to which tin is adhering is, for example, 0.1% or more and 10% or less of the area of the entire reflection surface 15a. In the present embodiment, when the predetermined value is X % as described above, the reference value is also X %. As the predetermined value, for example, a value in watt may be used instead of the percentage of the power decrease amount as described above. When the predetermined value and the reference value are different in unit or expression as above, the predetermined value and the reference value may not coincide with each other.

(Step SP16)

Figure 9:
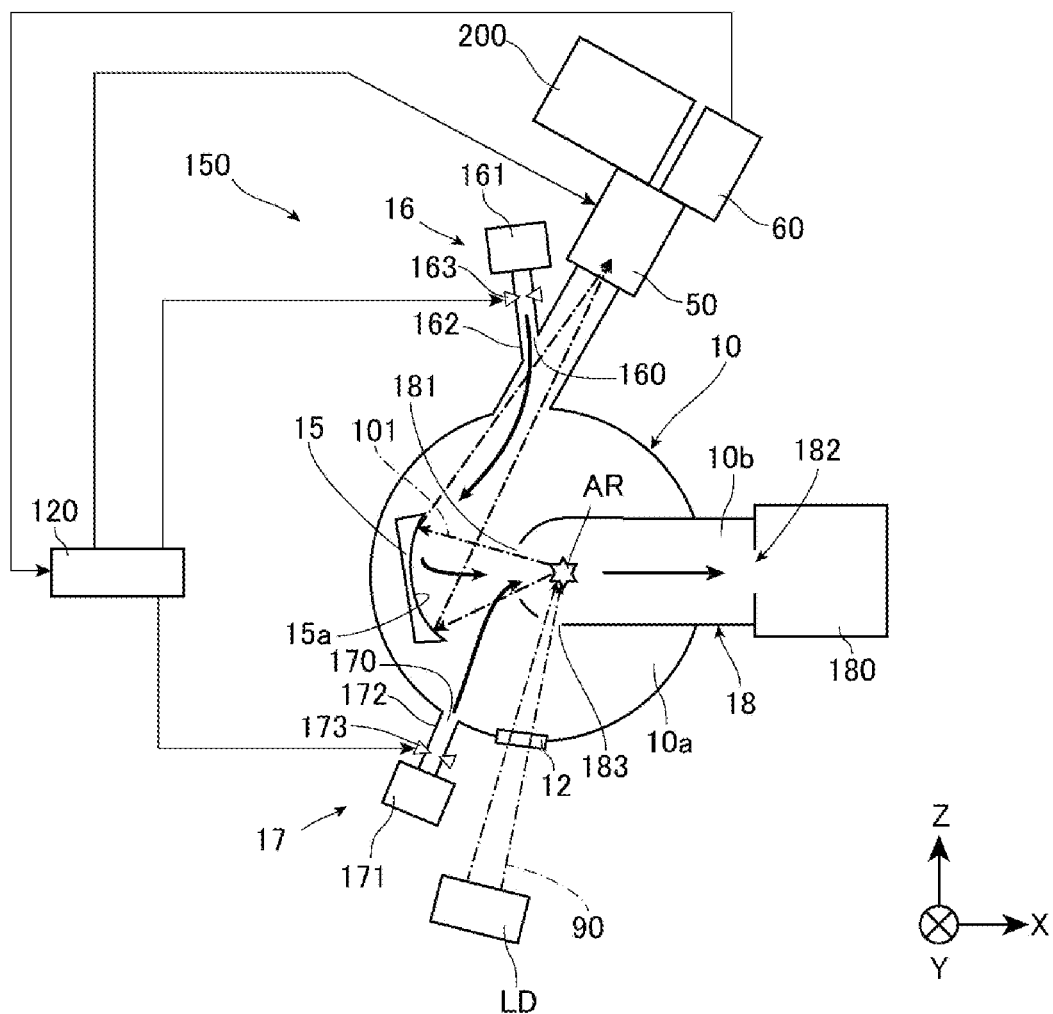
FIG. 9 is a schematic diagram showing the extreme ultraviolet light generation chamber device in a cleaning mode in the same manner as FIG. 4.

The present step is a step of decreasing the flow velocity, on the reflection surface 15a, of the etching gas supplied from the first etching gas supply unit 16. Here, proceeding to the present step means to enter a cleaning mode for removing tin adhering to the reflection surface. FIG. 9 is a schematic diagram of the EUV light generation chamber device 150 in the cleaning mode of the present embodiment shown in the same manner as FIG. 4. As shown in FIG. 9, in the present step, the processor 120 controls the first etching gas supply unit 16 to close the first valve 163. In the present example, the processor 120 does not completely close the first valve 163 but decreases the opening degree thereof. Therefore, the flow velocity of the etching gas supplied from the first gas supply port 160 to the reflection surface 15a of the EUV light concentrating mirror 15 decreases. As the flow velocity of the etching gas on the reflection surface 15a decreases, the density of hydrogen radicals on the reflection surface 15a increases. Therefore, tin adhering to the reflection surface 15a easily reacts with hydrogen radicals, and the etching of tin progresses.

Further, as shown in FIG. 9, the processor 120 controls the second etching gas supply unit 17 to open the second valve 173. Therefore, the etching gas is supplied from the second gas supply port 170 to the first space 10a, and the etching gas flows from the first opening 181 into the plasma generation region AR in the second space 10b. The processor 120 preferably controls the first etching gas supply unit 16 and the second etching gas supply unit 17 such that the flow velocity of the etching gas flowing into the plasma generation region AR is constant between the state before the present step and the state of the present step. Here, the state before the present step is a state in which the flow velocity of the etching gas supplied from the first etching gas supply unit 16 is not decreased. Further, the state of the present step is a state in which the flow velocity of the etching gas from the first etching gas supply unit 16 is decreased and the etching gas is supplied from the second etching gas supply unit 17. When the flow velocity of the etching gas flowing into the plasma generation region AR is constant, it is possible to prevent the trajectory of the droplet target DL from changing, and it is possible to prevent the generation efficiency of the EUV light 101 from decreasing.

After the control of step SP16 is completed, the processor 120 returns to step SP12 to continue the generation of the EUV light 101. At this time, the first etching gas supply unit 16 and the second etching gas supply unit 17 are maintained in the state as controlled in step SP16, and the flow velocity of the etching gas supplied from the first etching gas supply unit 16 remains decreased. That is, the cleaning mode is continued. The processor 120 proceeds to step SP13 again. At the timing immediately after the EUV light generation apparatus 100 is started up, before the EUV light generation apparatus 100 is shut off, or when the EUV light generation apparatus 100 is in a standby state, processing proceeds to step SP14 and proceeds to step SP15 again. Accordingly, the processor 120 repeats the loop from step SP12 to step SP16 until the data input to the processor 120 at step SP14 does not indicate that the power of the EUV light 101 has decreased by the predetermined value or more, and continues the cleaning mode.

(Step SP17)

The present step is a step of setting the flow velocity of the etching gas supplied from the first etching gas supply unit 16 to the predetermined flow velocity. When step SP16 is performed before the present step, the flow velocity of the etching gas supplied from the first etching gas supply unit 16 is decreased. Therefore, in the present step, the processor 120 controls the first etching gas supply unit 16 to open the first valve 163 and supply the etching gas from the first gas supply port 160 at the predetermined flow velocity. That is, when the data indicates that the amount of decrease in the reflectance of the EUV light concentrating mirror 15 is less than the reference value in a state that the first etching gas supply unit 16 is controlled to decrease the flow velocity of the etching gas on the reflection surface 15a supplied from the first etching gas supply unit 16, the processor 120 controls the first etching gas supply unit 16 to increase the flow velocity of the etching gas supplied from the first etching gas supply unit 16. Further, in the present step, the processor 120 controls the second etching gas supply unit 17 to close the second valve 173. Therefore, the etching gas is not to be supplied from the second gas supply port 170. Thus, the cleaning mode is finished. Here, when step SP16 is not performed before the present step, the processor 120 maintains the state in which the etching gas is supplied from the first gas supply port 160 at the predetermined flow velocity.

Next, the processor 120 proceeds to step SP18.

(Step SP18)

The present step is a step of determining whether or not to continue the output of the EUV light 101. The processor 120 returns to step SP12 when the output of the EUV light 101 is to be continued, and proceeds to the end step when the output of the EUV light 101 is not to be continued. In the end step, the processor 120 controls the laser device LD, the target supply unit 40, and the like to stop the generation of the EUV light 101. At this time, the processor 120 may control the actuator 52 so that the optical path switching mirror 51 is set to the second state in the end step, so that the EUV light 101 is not output from the first emission port 111.

4.3 Effect

The EUV light generation chamber device 150 of the present embodiment includes the EUV light measurement instrument 60 as the data generation unit that generates the data reflecting the reflectance of the EUV light concentrating mirror 15. The processor 120 controls the first etching gas supply unit 16 to decrease the flow velocity of the etching gas supplied to the reflection surface 15a when the data output from the EUV light measurement instrument 60 indicates that the amount of decrease in the reflectance is equal to or more than the reference value. Therefore, when the reflectance of the EUV light concentrating mirror 15 decreases, the density of hydrogen radicals on the reflection surface 15a can be increased and the etching of the tin adhering to the reflection surface 15a can be promoted. Therefore, according to the EUV light generation chamber device 150 of the present embodiment, it is possible to suppress the decrease in the power of the EUV light 101 output from the EUV light generation apparatus 100.

Further, the processor 120 does not perform the control to decrease the flow velocity of the etching gas supplied from the first etching gas supply unit 16 when the data does not indicate that the amount of decrease in the reflectance of the EUV light concentrating mirror 15 is equal to or more than the reference value. Since the flow velocity of the etching gas on the reflection surface 15a is not unnecessarily decreased, occurrence of hydrogen blistering can be suppressed by suppressing unnecessary occurrence of a state in which the density of hydrogen radical is high on the reflection surface 15a.

Further, in the present embodiment, the data of the power of the EUV light 101 measured by the EUV light measurement instrument 60 is data reflecting the reflectance of the EUV light concentrating mirror 15. The power of the EUV light 101 entering the EUV light measurement instrument 60 depends on the reflectance of the EUV light concentrating mirror 15. Therefore, according to the EUV light generation chamber device 150 of the present embodiment, it is possible to accurately measure the decrease in the reflectance of the EUV light concentrating mirror 15.

Further, the present embodiment is provided with the optical path switching mirror 51 which can switch between the first state in which the EUV light 101 reflected by the EUV light concentrating mirror 15 is reflected to the first emission port 111 and the second state in which the EUV light 101 is reflected to the second emission port 112. By controlling the EUV light 101 to enter the EUV light measurement instrument 60 by the optical path switching mirror 51, the EUV light measurement instrument 60 can accurately measure the power of the EUV light 101 as compared with a case in which a part of the EUV light 101 reflected by the EUV light concentrating mirror 15 enters EUV light measurement instrument 60.

4.4 Description of Modification

Figure 10:
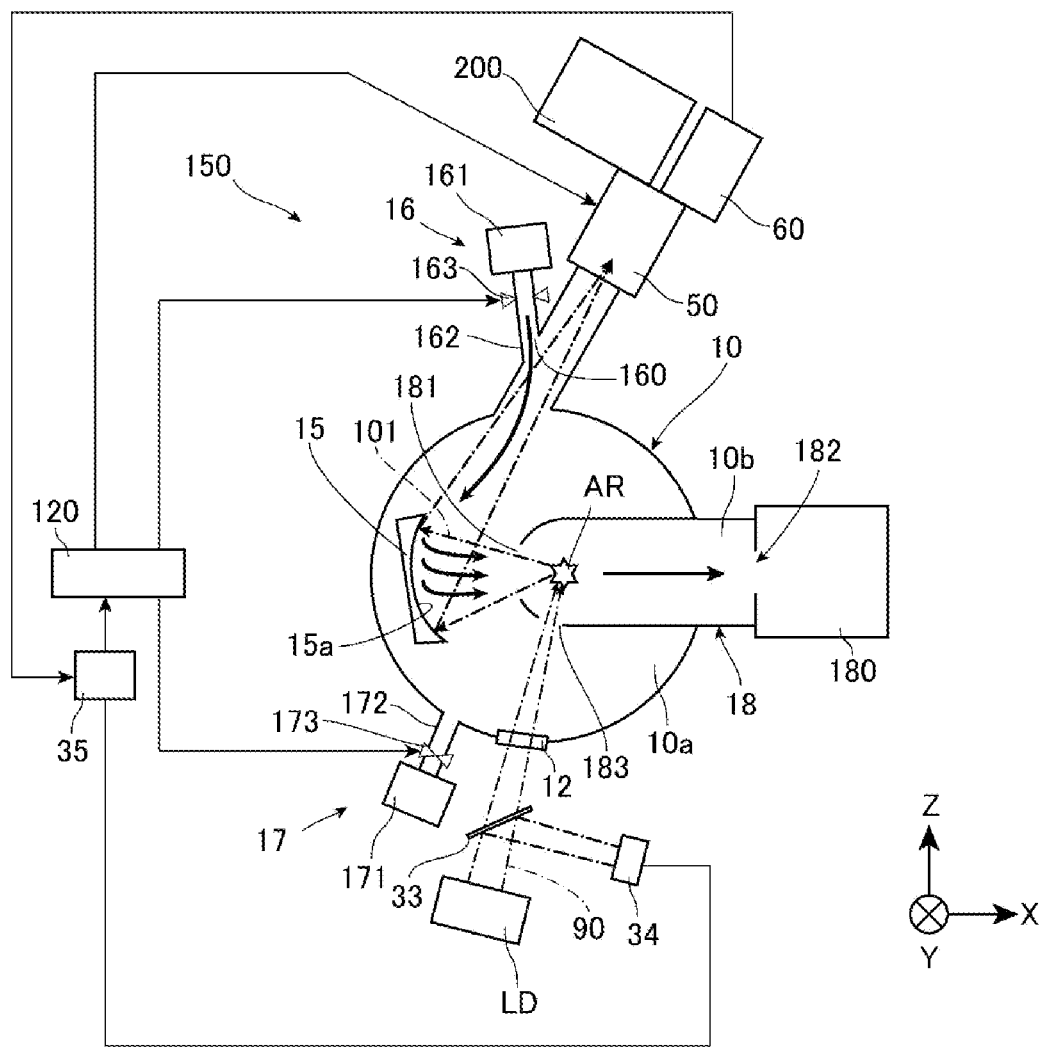
FIG. 10 is a schematic diagram of the extreme ultraviolet light generation chamber device of a modification of the first embodiment shown in the same manner as FIG. 4.

Next, a modification of the EUV light generation chamber device 150 of the first embodiment will be described. FIG. 10 is a schematic diagram including a cross section of the chamber 10 according to the modification of the first embodiment. As shown in FIG. 10, the EUV light generation chamber device 150 of the present modification differs from the EUV light generation chamber device 150 of the first embodiment in that a power ratio generation unit 35 is provided. Here, the beam splitter 33 and the laser light measurement instrument 34 are omitted in FIG. 6, but are shown in FIG. 10.

The power ratio generation unit 35 is an arithmetic unit and is electrically connected to the processor 120. Therefore, the power ratio generation unit 35 may be a part of the processor 120. The power ratio generation unit 35 is electrically connected to the laser light measurement instrument 34, and data related to the power of the laser light 90 measured by the laser light measurement instrument 34 is input to the power ratio generation unit 35. Further, the power ratio generation unit 35 is electrically connected to the EUV light measurement instrument 60, and data related to the power of the EUV light 101 measured by the EUV light measurement instrument 60 is input to the power ratio generation unit 35. In the present modification, the power ratio generation unit 35 obtains a ratio between the power of the EUV light 101 measured by the EUV light measurement instrument 60 and the power of the laser light 90 measured by the laser light measurement instrument 34 from the input data. The power ratio generation unit 35 outputs data related to the generated ratio, and the data is input to the processor 120.

When the reflectance of the EUV light concentrating mirror 15 decreases, the power of the EUV light 101 reflected by the EUV light concentrating mirror 15 decreases with respect to the power of the laser light 90. Therefore, the power of the EUV light 101 measured by the EUV light measurement instrument 60 decreases, and the ratio generated by the power ratio generation unit 35 changes. For example, in the case of a ratio obtained by dividing the power of the EUV light 101 measured by the EUV light measurement instrument 60 by the power of the laser light 90 measured by the laser light measurement instrument 34, the ratio decreases. Conversely, in the case of a ratio obtained by dividing the power of the laser light 90 measured by the laser light measurement instrument 34 by the power of the EUV light 101 measured by the EUV light measurement instrument 60, the ratio increases. As described above, in the present modification, the data of the ratio generated by the power ratio generation unit 35 is data reflecting the reflectance of the EUV light concentrating mirror 15. Therefore, in the present modification, the power ratio generation unit 35 is the data generation unit that generates the data reflecting the reflectance of the EUV light concentrating mirror 15. In the following description, the ratio obtained by dividing the power of the EUV light 101 measured by the EUV light measurement instrument 60 by the power of the laser light 90 measured by the laser light measurement instrument 34 is used.

Figure 11:
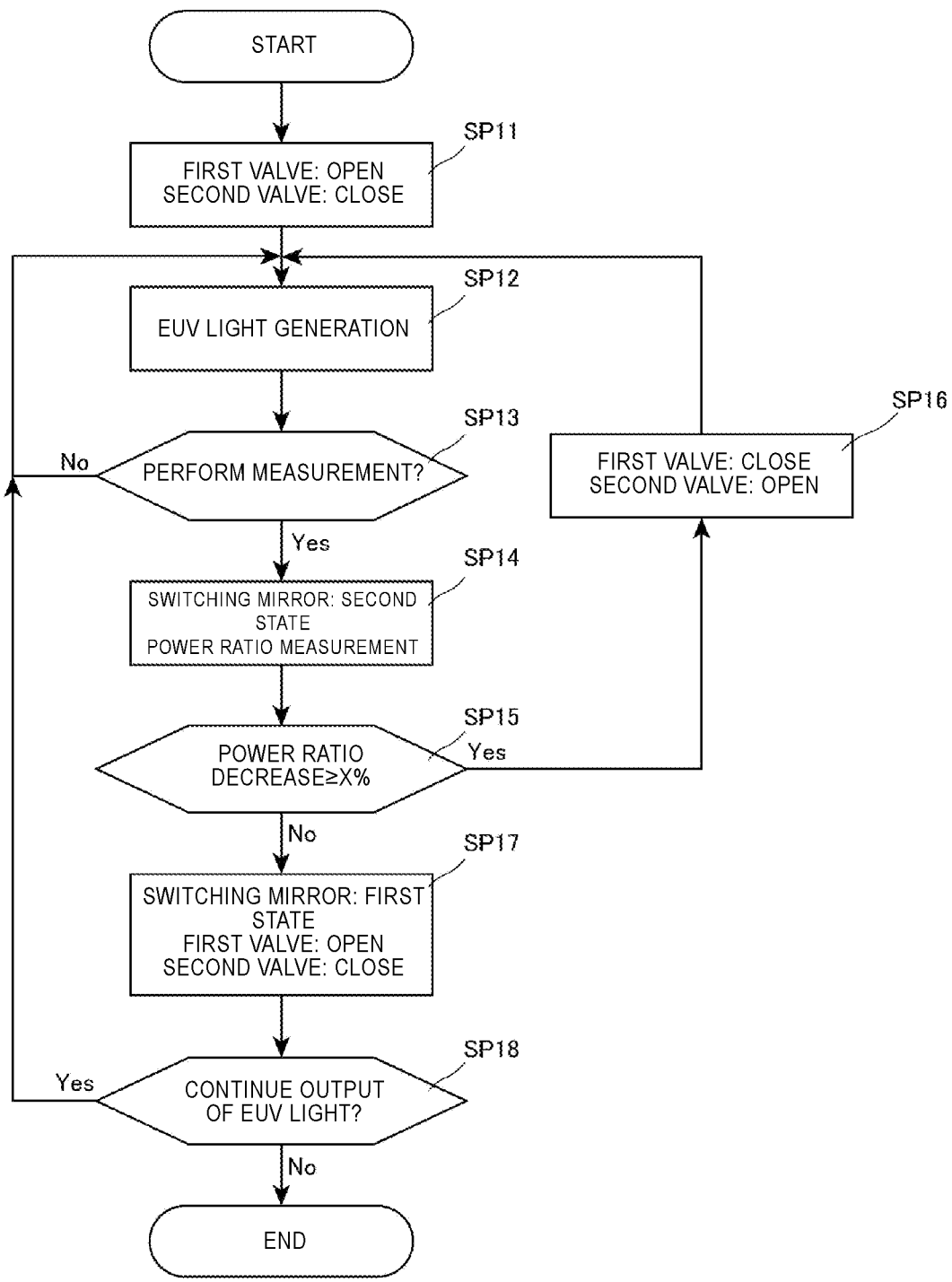
FIG. 11 is a diagram showing an example of a control flowchart of the processor according to the modification of the first embodiment.

Next, operation of the modification will be described. FIG. 11 is a diagram showing an example of a control flowchart of the processor 120 according to the present modification. As shown in FIG. 11, in the present modification, step SP14 and step SP15 mainly differ from those in the flowchart of the first embodiment.

As described in the comparative example, the power of the laser light 90 entering the chamber 10 is measured by the laser light measurement instrument 34. Therefore, while the EUV light 101 is being generated, the data related to the power of the laser light 90 is input from the laser light measurement instrument 34 to the power ratio generation unit 35.

Further, in the start state shown in FIG. 11, data related to the above-described ratio immediately after the EUV light generation chamber device 150 is replaced is stored in the internal memory of the processor 120. Specifically, in the same manner as in the first embodiment, immediately after the EUV light generation chamber device 150 is replaced, the EUV light measurement instrument 60 outputs the data related to the power of the EUV light 101. This data is input to the power ratio generation unit 35. In addition, the power of the laser light 90 at this time is measured by the laser light measurement instrument 34, and the data related to the power of the laser light 90 is input from the laser light measurement instrument 34 to the power ratio generation unit 35. The power ratio generation unit 35 generates the above-described ratio from these data and outputs data related to the ratio. This data is input to the processor 120. The processor 120 stores this data in the internal memory. Thus, the data related to the above-described ratio immediately after the EUV light generation chamber device 150 is replaced is stored in the memory of the processor 120. The data related to this ratio may be obtained in advance by an experiment or the like and stored in the memory of the processor 120.
(Step SP14)

In the present modification, in step SP14, when the power of the EUV light 101 is measured in the same manner as in the first embodiment, the EUV light measurement instrument 60 outputs the data related to the power to the power ratio generation unit 35. While the EUV light 101 is being generated, the power ratio generation unit 35 generates the above-described ratio as the data related to the power of the laser light 90 is input from the laser light measurement instrument 34 to the power ratio generation unit 35.
(Step SP15)

The present step of the present modification is a step of determining whether the ratio generated by the power ratio generation unit 35 indicates decrease by a predetermined value or more. In the present step, the processor 120 compares the ratio immediately after the EUV light generation chamber device 150 is replaced with the ratio generated by the power ratio generation unit 35 in step SP14 using the data stored in the internal memory. When the data input to the processor 120 in step SP14 indicates that the above-described ratio is decreased by the predetermined value or more, the processor 120 proceeds to step SP16. On the other hand, when the data input to the processor 120 in step SP14 does not indicate that the above-described ratio is decreased by the predetermined value or more, the processor 120 proceeds to step SP17. The predetermined value is a value obtained by dividing the difference between the above-described ratio immediately after the EUV light generation chamber device 150 is replaced and the ratio generated by the power ratio generation unit 35 in step SP14 by the above-described ratio immediately after the EUV light generation chamber device 150 is replaced, and is expressed as a percentage. Assuming that the predetermined value is X %, X % is any value in the range of, for example, 0.1% or more and 10% or less. When the reflectance of the EUV light concentrating mirror 15 decreases, since the power of the EUV light 101 entering the EUV light measurement instrument 60 decreases, the above-described ratio also decreases. Therefore, when the data input to the processor 120 in step SP14 indicates that the above-described ratio is decreased by the predetermined value or more, the data indicates that the amount of decrease in the reflectance of the EUV light concentrating mirror 15 is equal to or more than the reference value.

Here, the ratio obtained by dividing the power of the laser light 90 measured by the laser light measurement instrument 34 by the power of the EUV light 101 measured by the EUV light measurement instrument 60 may be used. In this case, when the data input to the processor 120 in step SP14 indicates that the ratio is increased by a predetermined value or more, the processor 120 proceeds to step SP16.

According to the present modification, since the ratio between the power of the laser light 90 measured by the laser light measurement instrument 34 and the power of the EUV light 101 measured by the EUV light measurement instrument 60 is used, even when the power of the laser light 90 fluctuates, it is possible to appropriately detect decrease in the reflectance of the EUV light concentrating mirror 15.

5. Description of Extreme Ultraviolet Light Generation Chamber Device of Second Embodiment Next, the configuration of the EUV light generation chamber device 150 of a second embodiment will be described. Any component same as that described above is denoted by an identical reference sign, and duplicate description thereof is omitted unless specific description is needed.

5.1 Configuration

Figure 12:
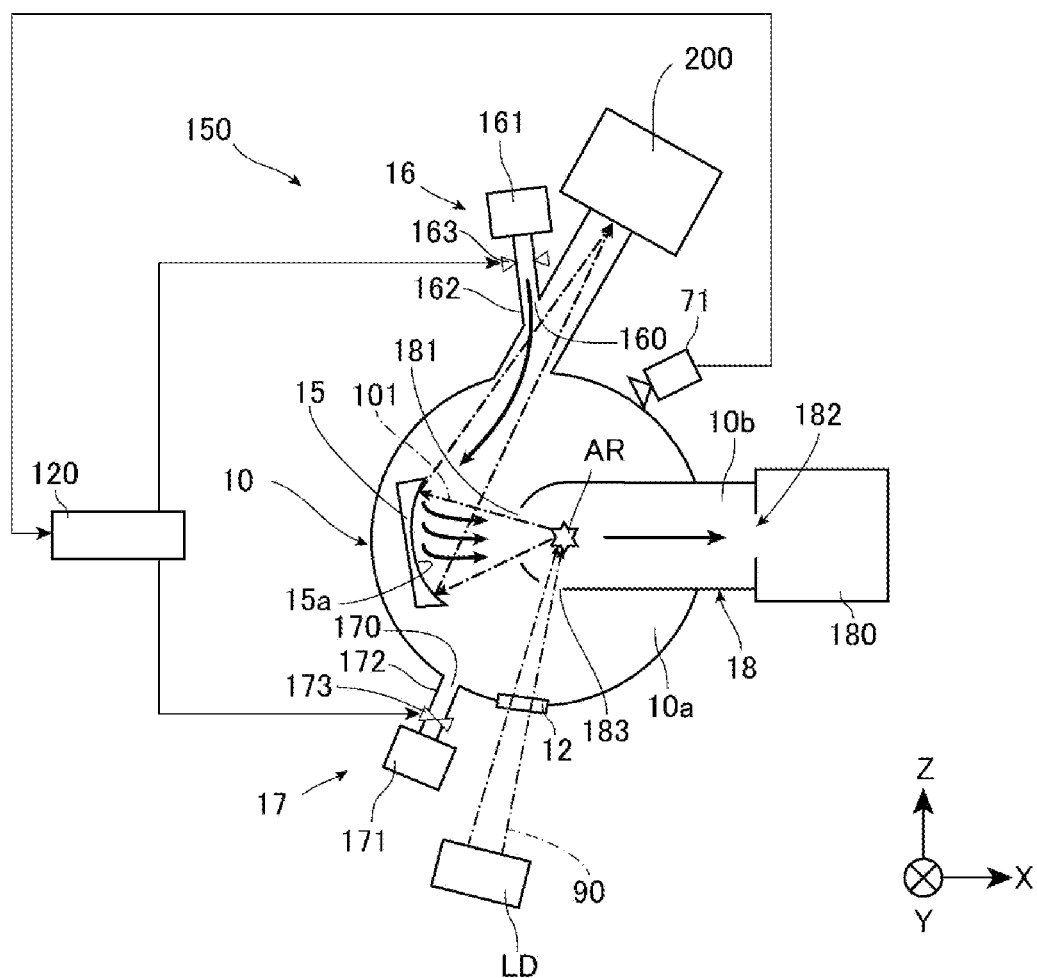
FIG. 12 is a schematic diagram of the extreme ultraviolet light generation chamber device of a second embodiment shown in the same manner as FIG. 4.

FIG. 12 is a schematic diagram of the EUV light generation chamber device 150 of the present embodiment shown in the same manner as FIG. 4. The EUV light generation chamber device 150 of the present embodiment mainly differs from the EUV light generation chamber device 150 of the of the comparative example in including a camera 71 and the second etching gas supply unit 17. Further, the optical path switching mechanism 50 and the EUV light measurement instrument 60 may not be included.

The camera 71 images the reflection surface 15a of the EUV light concentrating mirror 15. The camera 71 may be, for example, a CCD camera. The camera 71 may image a still image or a moving image. The camera 71 may be arranged inside the chamber 10, but may be arranged outside the chamber 10 and image the reflection surface 15a in the first space 10a through a window (not shown) to suppress adhesion of tin. The range imaged by the camera 71 may be the entire reflection surface 15a, or may be a region where tin is likely to adhere among the reflection surface 15a. The camera 71 is electrically connected to the processor 120, and data of an image imaged by the camera 71 is input to the processor 120. Here, an illumination (not shown) that brightens the reflection surface 15a may be provided so that the camera 71 can easily image the reflection surface 15a. In this case as well, in order to suppress adhesion of tin, it is preferable that the illumination is arranged outside the chamber 10 and the reflection surface 15a is irradiated with light through the window (not shown).

A state in which the reflectance of the EUV light concentrating mirror 15 decreases is a state in which tin is adhering to the reflection surface 15a. The region where tin is adhering is observed differently from the other regions. For example, it tends to be dark. This state can be captured by the camera 71. Therefore, the data of the image captured by the camera 71 is data reflecting the reflectance of the EUV light concentrating mirror 15. Further, in the present embodiment, the camera 71 is the data generation unit that generates data reflecting the reflectance of the EUV light concentrating mirror 15.

5.2 Operation

Figure 13:
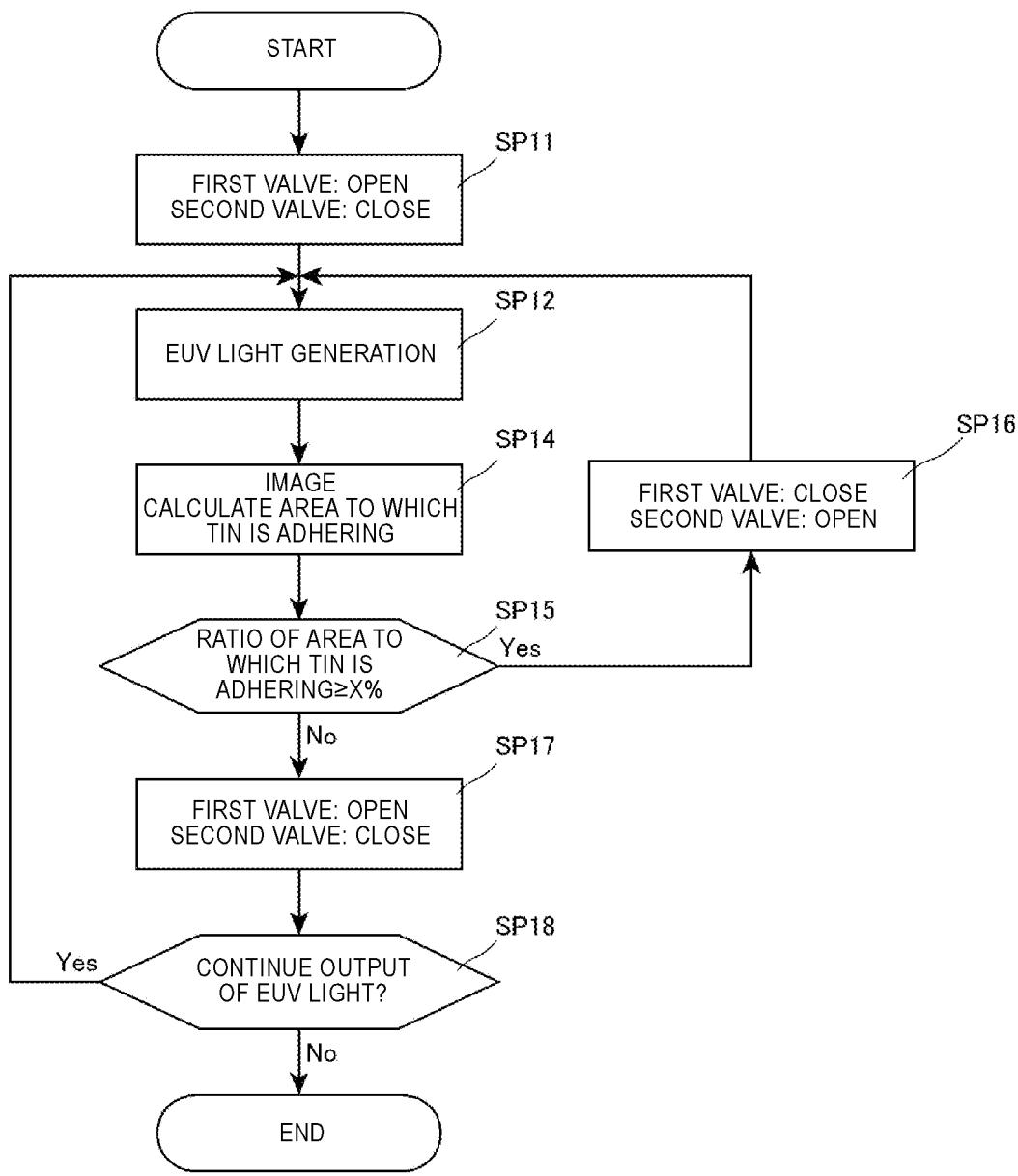
FIG. 13 is a diagram showing an example of a control flowchart of the processor according to the second embodiment.

Next, operation of the present embodiment will be described. FIG. 13 is a diagram showing an example of a control flowchart of the processor 120 according to the present embodiment. As shown in FIG. 13, in the present embodiment, step SP13 is not included, and step SP14 and step SP15 mainly differ from those in the flowchart of the first embodiment.
(Step SP14)

The present step of the present embodiment is a step of calculating the area of the region of the reflection surface 15a to which tin is adhering, using the data of the image. In the present step, the camera 71 images the reflection surface 15a and outputs the data related to the image. Therefore, the image data is input to the processor 120. Upon receiving the image data, the processor 120 performs, for example, binarization on each pixel of the image for differentiation depending on whether tin is adhering or not. The binarization is performed, for example, based on the luminance of each pixel. Next, the processor 120 calculates an area to which tin is adhering, and calculates a ratio of the area with respect to that of the reflection surface 15a. Thereafter, the processor 120 proceeds to step SP15. Here, in the present embodiment, while the EUV light 101 is being generated, the camera 71 may image the reflection surface 15a. In this case, the data related to the image is input to the processor 120 from the start state.

(Step SP15)

The present step of the present embodiment is a step of determining whether the image data indicates that the ratio of the area of the region where the reflectance is deteriorated among the reflection surface 15a is equal to or more than a predetermined ratio. In the present step, the processor 120 compares the ratio calculated in step SP14 with the predetermined ratio stored in the internal memory in advance. As a result of the comparison, when the ratio calculated in step SP14 is equal to or more than the predetermined ratio, the processor 120 proceeds to step SP16. On the other hand, when the ratio calculated in step SP14 is not equal to or more than the predetermined ratio, the processor 120 proceeds to step SP17. The predetermined ratio is a value obtained by dividing the area to which tin is adhering by the area of the reflection surface 15a, and is expressed as a percentage. Assuming that the predetermined value is X %, X % is any value in the range of, for example, 0.1% or more and 10% or less. When the data input to the processor 120 indicates that the ratio calculated in step SP14 is equal to or more than the predetermined ratio X %, the data indicates that the amount of decrease in the reflectance of the EUV light concentrating mirror 15 is equal to or more than the reference value. This reference value is similar to the reference value of the first embodiment.

5.3 Effect

According to the present embodiment, since the image data of the reflection surface 15a imaged by the camera 71 is used, the ratio of tin adhesion can be directly calculated, and the adhesion state of tin can be accurately grasped. Furthermore, there is no need to measure the power of the EUV light 101 in order to determine the deterioration of the reflectance, and there is no need to switch the EUV optical path. Here, when an image imaged by the camera 71 is displayed on a monitor as a picture, a person can perceptually grasp the adhesion state of tin.

6. Description of Extreme Ultraviolet Light Generation Chamber Device of Third Embodiment Next, the configuration of the EUV light generation chamber device 150 of a third embodiment will be described. Any component same as that described above is denoted by an identical reference sign, and duplicate description thereof is omitted unless specific description is needed.

6.1 Configuration

Figure 14:
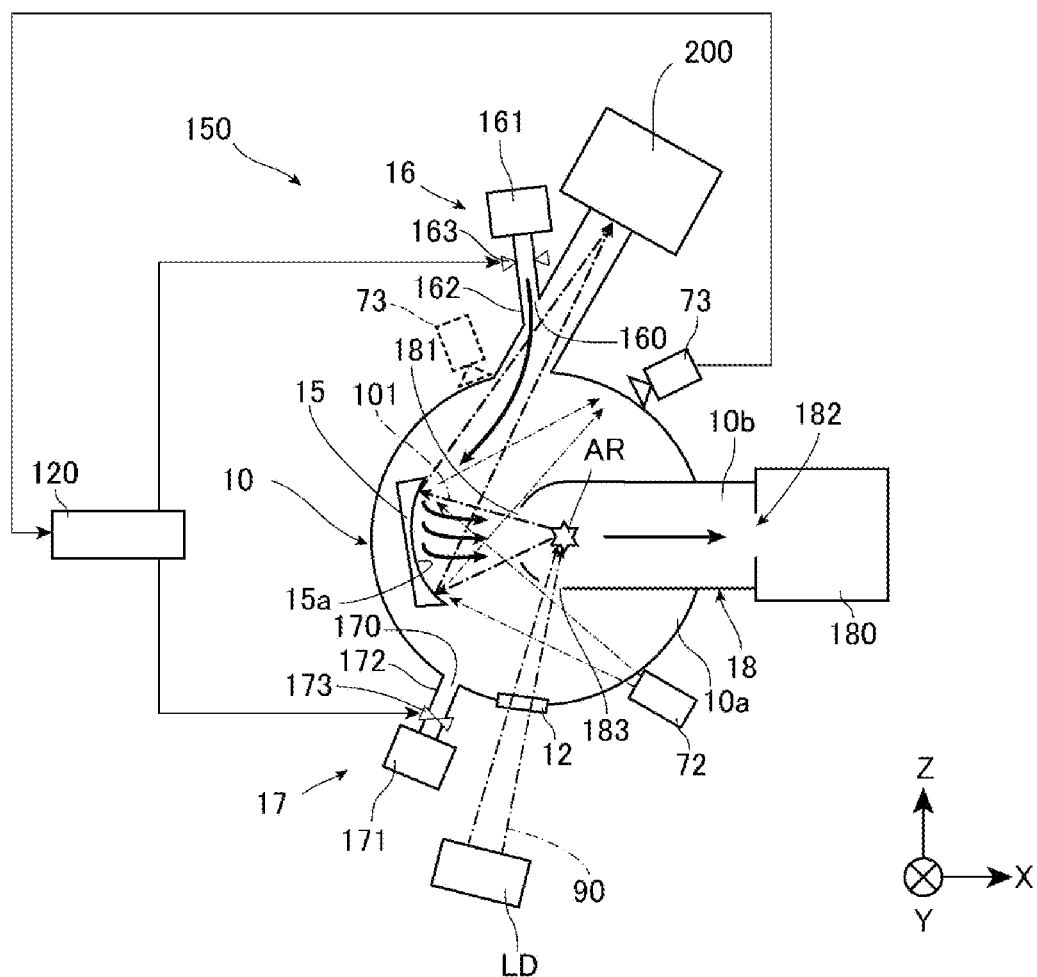
FIG. 14 is a schematic diagram of the extreme ultraviolet light generation chamber device of a third embodiment shown in the same manner as FIG. 4.

FIG. 14 is a schematic diagram of the EUV light generation chamber device 150 of the present embodiment shown in the same manner as FIG. 4. The EUV light generation chamber device 150 of the present embodiment mainly differs from the EUV light generation chamber device 150 of the comparative example in including a light source 72, a light measurement instrument 73, and the second etching gas supply unit 17. Further, the optical path switching mechanism 50 and the EUV light measurement instrument 60 may not be included.

The light source 72 irradiates the reflection surface 15a of the EUV light concentrating mirror 15 with light. Examples of the light source 72 include a laser light source, an LED, and a white light source. In order to suppress adhesion of tin, it is preferable that the light source 72 is arranged outside the chamber 10 and the reflection surface 15a is irradiated with the light through the window (not shown). The light source 72 may irradiate the entire reflection surface 15a with the light, but may irradiate a region where tin is likely to adhere among the reflection surface 15a with the light.

The light measurement instrument 73 is provided at a position where the light measurement instrument 73 receives the light radiated from the light source 72 to the reflection surface 15a and then specularly reflected. The light measurement instrument 73 measures the power of the specularly reflected light. Examples of the light measurement instrument 73 include a commercially available optical power meter. In order to suppress adhesion of tin, it is preferable that the light measurement instrument 73 is arranged outside the chamber 10 and the reflection surface 15a receives the specularly reflected light through the window (not shown). The light measurement instrument 73 is electrically connected to the processor 120, and data related to the power of the light measured by the light measurement instrument 73 is input to the processor 120.

A state in which the reflectance of the EUV light concentrating mirror 15 decreases is a state in which tin is adhering to the reflection surface 15a. Therefore, when tin is adhering to the reflection surface 15a, the power of the light measured by the light measurement instrument 73 decreases. Therefore, the data related to the power of the light measured by the light measurement instrument 73 is data reflecting the reflectance of the EUV light concentrating mirror 15. Further, in the present embodiment, the light measurement instrument 73 is the data generation unit that generates data reflecting the reflectance of the EUV light concentrating mirror 15.

6.2 Operation

Figure 15:
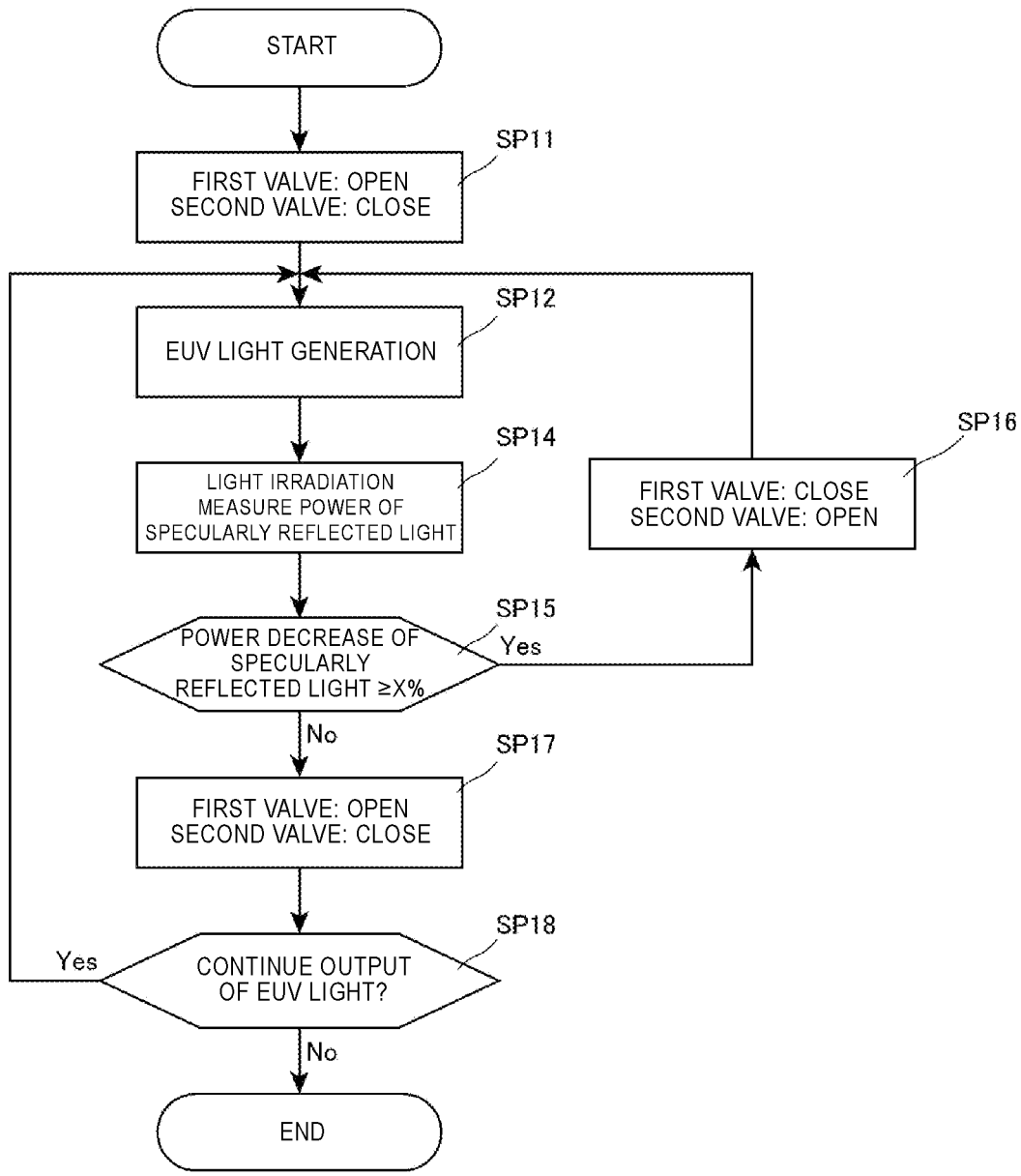
FIG. 15 is a diagram showing an example of a control flowchart of the processor according to the third embodiment.

Next, operation of the present embodiment will be described. FIG. 15 is a diagram showing an example of a control flowchart of the processor 120 according to the present embodiment. As shown in FIG. 15, in the present embodiment, step SP13 is not included, and step SP14 and step SP15 mainly differ from those in the flowchart of the first embodiment.

In the present embodiment, in the start state shown in FIG. 15, the data related to the power, immediately after the EUV light generation chamber device 150 is replaced, of the light from the light source 72, specularly reflected at the reflection surface 15a, and measured by the light measurement instrument 73 is stored in the internal memory of the processor 120. Specifically, immediately after the EUV light generation chamber device 150 is replaced, the light is radiated from the light source 72 to the reflection surface 15a, and the light measurement instrument 73 receives the light specularly reflected by the reflection surface 15a and outputs data of the power of the received light. This data is input to the processor 120. Thus, the data related to the power of the light measured by the light measurement instrument 73 immediately after the EUV light generation chamber device 150 is replaced is stored in the memory of the processor 120. The data related to the power of the light may be obtained in advance by an experiment or the like and stored in the memory of the processor 120.

(Step SP14)

The present step of the present embodiment is a step of measuring the power of the light from the light source 72 that is specularly reflected by the reflection surface 15a. In the present step, the light source 72 irradiates the reflection surface 15a with the light, and the light measurement instrument 73 receives the light specularly reflected by the reflection surface 15a, and outputs the data of the power of the received light. The output data is input to the processor 120. Thereafter, the processor 120 proceeds to step SP15. Here, in the present embodiment, while the EUV light 101 is being generated, the light source 72 may irradiate the reflection surface 15a with the light. In this case, while the EUV light 101 is being generated, the light measurement instrument 73 may output the data of the power of the measured light. In this case, the data of the power of the light measured by the light measurement instrument 73 is input to the processor 120 from the start state.

(Step SP15)

The present step of the present embodiment is a step of determining whether the power of the light measured by the light measurement instrument 73 has decreased by a predetermined value or more. In the present step, the processor 120 compares the power of the light measured by the light measurement instrument 73 immediately after the EUV light generation chamber device 150 is replaced with the power of the light measured by the light measurement instrument 73 in step SP14 using the data stored in the internal memory. Then, when the data input to the processor 120 in step SP14 indicates that the power of the light measured by the light measurement instrument 73 has decreased by the predetermined value or more, the processor 120 proceeds to step SP16. On the other hand, when the data does not indicate that the power of the light measured by the light measurement instrument 73 has decreased by the predetermined value or more, the processor 120 proceeds to step SP17. The predetermined value is a value obtained by dividing the difference between the power of the light immediately after the EUV light generation chamber device 150 is replaced and the power of the light in step SP14 by the power immediately after the EUV light generation chamber device 150 is replaced, and is expressed as a percentage. Assuming that the predetermined value is X %, X % is any value in the range of, for example, 0.1% or more and 10% or less. When the reflectance of the EUV light concentrating mirror 15 decreases, the power of the light measured by the light measurement instrument 73 also decreases. Therefore, when the data input to the processor 120 in step SP14 indicates that the power of the light measured by the light measurement instrument 73 has decreased by the predetermined value or more, the data indicates that the amount of decrease in the reflectance of the EUV light concentrating mirror 15 is equal to or more than a reference value. This reference value is similar to the reference value of the first embodiment.

6.3 Effect

According to the present embodiment, since decrease in the reflectance of the reflection surface 15a can be detected without measuring the power of the EUV light 101, it is possible to grasp tin adhesion to the reflection surface 15a while suppressing inhibition of the output of the EUV light 101.

6.4 Description of Modification

Next, a modification of the EUV light generation chamber device 150 of the third embodiment will be described. The present modification differs from the third embodiment in that light is radiated from the light source 72 to the reflection surface 15a and the light measurement instrument 73 measures the power of the light scattered by the reflection surface 15a. Therefore, the light measurement instrument 73 is not provided on the optical path of the light that is output from the light source 72 and specularly reflected by the reflection surface 15a, and is provided, for example, at a position indicated by broken lines in FIG. 14. Therefore, when tin is not adhering to the reflection surface 15a, the light measurement instrument 73 hardly receives the light from the light source 72.

Figure 16:
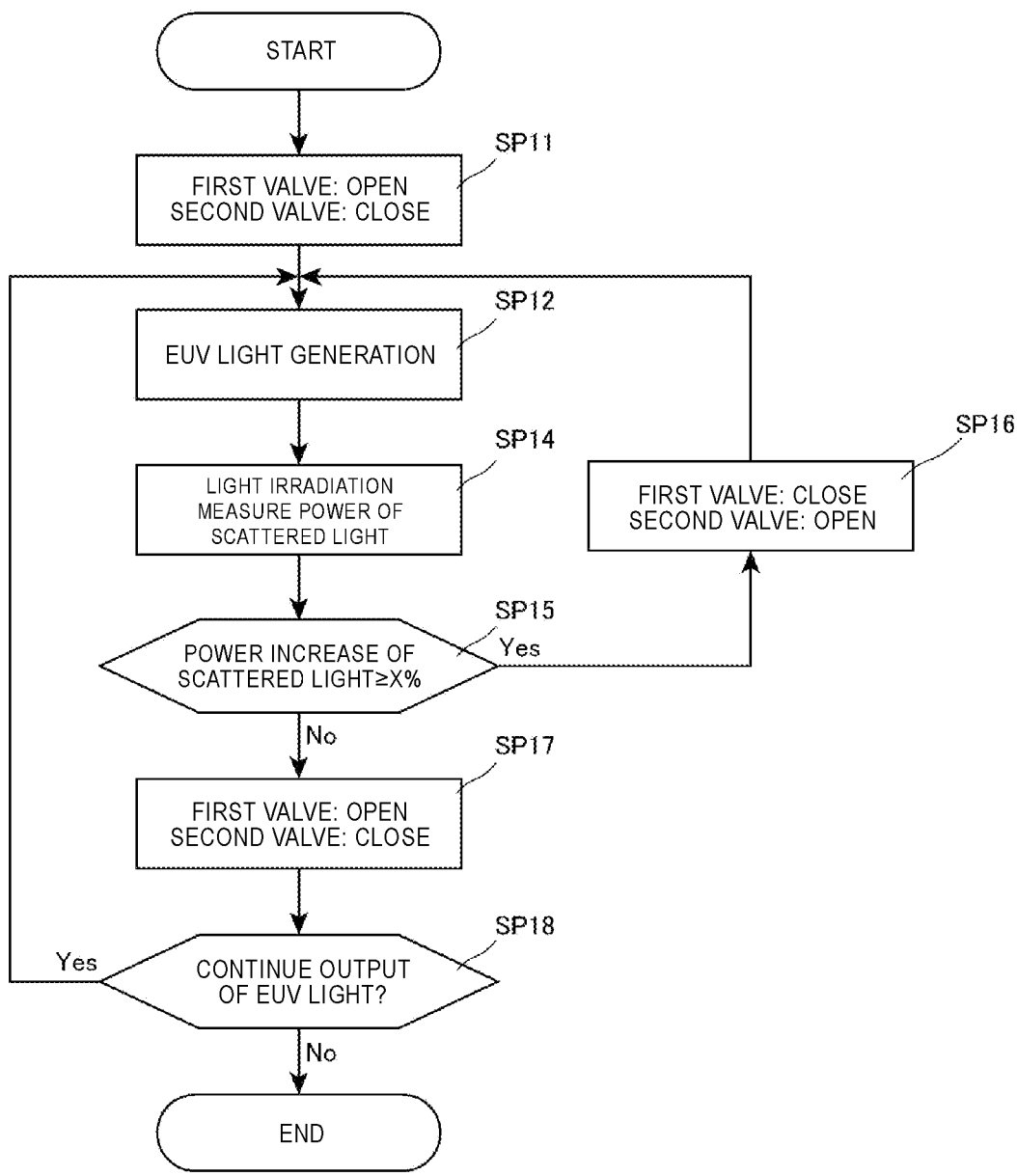
FIG. 16 is a diagram showing an example of a control flowchart of the processor according to a modification of the third embodiment.

Next, operation of the modification will be described. FIG. 16 is a diagram showing an example of a control flowchart of the processor 120 according to the present modification. Immediately after the EUV light generation chamber device 150 is replaced, tin is not adhering to the reflection surface 15a. In the present modification, in the start state shown in FIG. 16, the processor 120 stores the relationship between the power of the light measured by the light measurement instrument 73 and the reflectance of EUV light concentrating mirror 15 in the internal memory. This relationship may be obtained in advance by an experiment or the like. Further, the processor 120 stores, in the internal memory, initial reflectance which is the reflectance of the EUV light concentrating mirror 15 immediately after the EUV light generation chamber device 150 is replaced. Specifically, immediately after the EUV light generation chamber device 150 is replaced, the light is radiated from the light source 72 to the reflection surface 15a, and the light measurement instrument 73 receives the light scattered and reflected by the reflection surface 15a and outputs data of the power of the received light. The reflectance of the EUV light concentrating mirror 15 is calculated based on this data, and the reflectance is stored in the internal memory.

(Step SP14)

The present step of the present embodiment is a step of measuring the power of the light from the light source 72 that is scattered by the reflection surface 15a. In the present step, the light source 72 irradiates the reflection surface 15a with the light, and the light measurement instrument 73 receives the light scattered by the reflection surface 15a, and outputs the data of the power of the received light. The output data is input to the processor 120. Thereafter, the processor 120 proceeds to step SP15. Here, in the present modification as well, while the EUV light 101 is being generated, the light source 72 may irradiate the reflection surface 15a with the light. In this case, while the EUV light 101 is being generated, the light measurement instrument 73 may output the data of the power of the measured light. Further in this case, the data of the power of the light measured by the light measurement instrument 73 is input to the processor 120 from the start state.

(Step SP15)

The present step of the present modification is a step of determining whether the power of the light measured by the light measurement instrument 73 increases by a predetermined value or more. In the present step, when it is indicated that the power of the light measured by the light measurement instrument 73 is increased by the predetermined value or more in step SP14, the processor 120 proceeds to step SP16. On the other hand, when the data does not indicate that the power of the light measured by the light measurement instrument 73 increases by the predetermined value or more, the processor 120 proceeds to step SP17. The predetermined value is a value obtained by dividing the difference between the initial reflectance of the EUV light concentrating mirror 15 and the reflectance of the EUV light concentrating mirror 15 corresponding to the measured power of the scattered light by the initial reflectance, and is expressed as a percentage. Here, the initial reflectance of the EUV light concentrating mirror 15 may be the reflectance of the EUV light concentrating mirror 15 when the power of the scattered light is zero in the relationship between the power of the light measured by the light measurement instrument 73 and the reflectance of the EUV light concentrating mirror 15. Alternatively, it may be a value set or measured in advance. For example, it may be the reflectance immediately after the EUV light concentrating mirror 15 is incorporated in the device, or the reflectance immediately after maintenance. Assuming that the predetermined value is X %, X % is any value in the range of, for example, 0.1% or more and 10% or less.

7. Description of Extreme Ultraviolet Light Generation Chamber Device of Fourth Embodiment Next, the configuration of the EUV light generation chamber device 150 of a fourth embodiment will be described. Any component same as that described above is denoted by an identical reference sign, and duplicate description thereof is omitted unless specific description is needed.

7.1 Configuration

Figure 17:
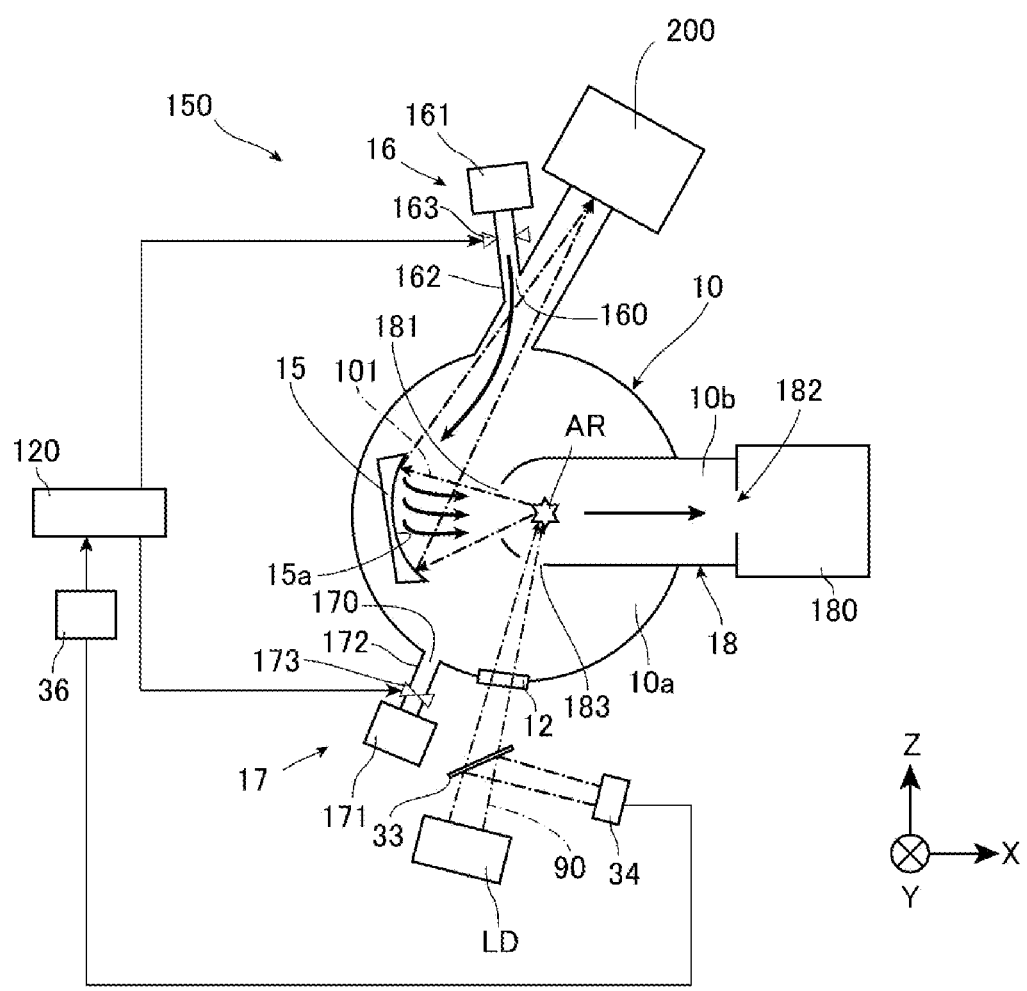
FIG. 17 is a schematic diagram of the extreme ultraviolet light generation chamber device of a fourth embodiment shown in the same manner as FIG. 4.

FIG. 17 is a schematic diagram of the EUV light generation chamber device of the present embodiment shown in the same manner as FIG. 4. The EUV light generation chamber device 150 of the present embodiment mainly differs from the EUV light generation chamber device 150 of the comparative example in including a pulse counter 36 and the second etching gas supply unit 17.

The pulse counter 36 is electrically connected to the laser light measurement instrument 34, and can measure the number of shots of the laser light 90 by measuring the number of times the power of the laser light 90 output from the laser light measurement instrument 34 increases. The pulse counter 36 is electrically connected to the processor 120, and data related to the number of shots of the laser light 90 measured by the pulse counter 36 is input to the processor 120.

Figure 18:
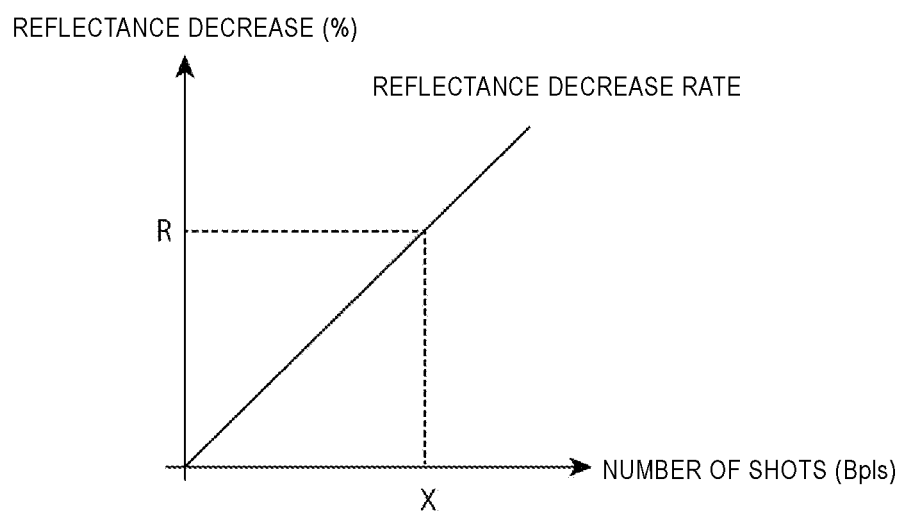
FIG. 18 is a graph showing the relationship between the number of shots of laser light and decrease rate of reflectance of an extreme ultraviolet light concentrating mirror.

FIG. 18 is a graph showing the relationship between the number of shots of the laser light 90 and the decrease rate of the reflectance of the EUV light concentrating mirror 15. As shown in FIG. 18, in a normal operation mode, each time the droplet target DL is irradiated with the laser light 90 and the EUV light 101 is generated, tin adheres to the reflection surface 15a and the reflectance of the EUV light concentrating mirror 15 decreases. Therefore, the data related to the number of shots of the laser light 90 is data reflecting the reflectance of EUV light concentrating mirror 15. Further, in the present embodiment, the pulse counter 36 is the data generation unit that generates data reflecting the reflectance of the EUV light concentrating mirror 15.

7.2 Operation

Figure 19:
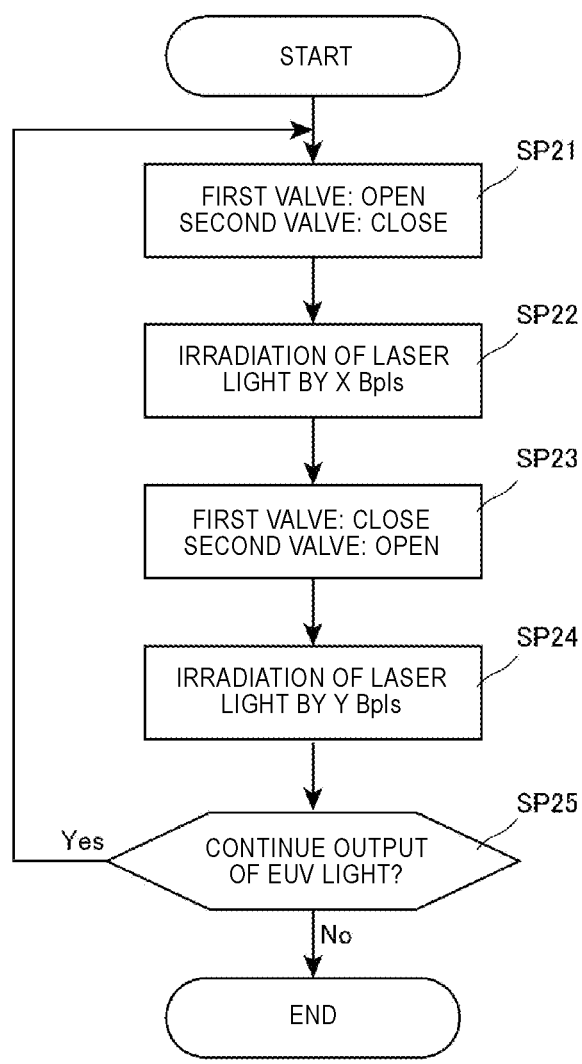
FIG. 19 is a diagram showing an example of a control flowchart of the processor according to the fourth embodiment.

Next, operation of the present embodiment will be described. FIG. 19 is a diagram showing an example of a control flowchart of the processor 120 according to the present embodiment. This control flow includes steps SP21 to SP25.

Figure 20:
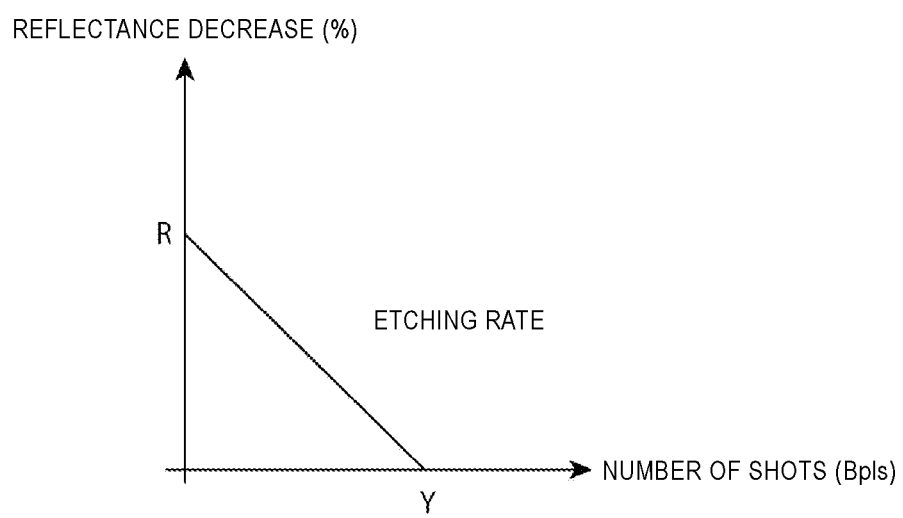
FIG. 20 is a graph showing the relationship between the number of shots of the laser light in a cleaning mode and the decrease rate of the reflectance of the extreme ultraviolet light concentrating mirror.

In the present embodiment, the pulse counter 36 counts the number of shots of the laser light 90 from the start state and outputs the data related to the number of shots, and the data is input to the processor 120.
(Step SP21)
The present step is similar to step SP11 of the first embodiment.
(Step SP22)
The present step is a step in which the processor 120 detects that the number of shots of the laser light 90 has reached a predetermined value. The predetermined number of shots is, for example, X Bpls (billion pulses). X Bpls is the number of pulses at which the amount of decrease in the reflectance of the EUV light concentrating mirror 15 with respect to the initial reflectance of the EUV light concentrating mirror 15 is equal to or more than a reference value R %. The initial reflectance may be similar to that of the modification of the third embodiment. R % is, for example, any value in the range of, for example, 0.1% or more and 10% or less. When the data input to the processor 120 in the present step indicates that the number of shots has reached the predetermined value, it indicates that the amount of decrease in the reflectance of the EUV light concentrating mirror 15 is equal to or more than the reference value.
(Step SP23)
The present step is a step in which the processor 120 controls the first etching gas supply unit 16 and the second etching gas supply unit 17 in the same manner as in step SP16 of the first embodiment. Therefore, the flow velocity of the etching gas on the reflection surface 15a decreases, and tin adhering to the reflection surface 15a is etched. That is, in the present step, the cleaning mode is set. FIG. 20 is a graph showing the relationship between the number of shots of the laser light 90 in the cleaning mode and the decrease rate of the reflectance of the EUV light concentrating mirror 15. As shown in FIG. 20, when the number of shots of the laser light 90 reaches Y Bpls from a state in which the amount of decrease in the reflectance of the EUV light concentrating mirror 15 is the reference value R %, tin adhering to the reflection surface 15a is substantially etched.
(Step SP24)
The present step is a step in which the processor 120 detects that the number of shots of the laser light 90 has reached Y Bpls after the state of step SP23. When it is detected in the present step that the number of shots has reached Y Bpls, the processor 120 proceeds to step SP25.
(Step SP25)
The present step is similar to step SP18 of the first embodiment. However, in the present embodiment, when the output of the EUV light 101 is to be continued, processing returns to step SP21.

7.3 Effect

According to the present embodiment, since adhesion of tin on the reflection surface 15a is detected by the number of shots of the laser light 90 by the pulse counter 36, the configuration is simplified.

Although the embodiments of the present invention have been described above as examples, the above-described embodiments can be modified as appropriate. For example, in the first embodiment to the third embodiment, the pulse counter 36 similar to that of the fourth embodiment may be included, and when the predetermined number of shots Y Bpls is reached after being in the state of step SP16, processing may return to step SP11. That is, the processor 120 may control the first etching gas supply unit 16 to increase the flow velocity of the etching gas when the number of shots of the laser light 90 after controlling the first etching gas supply unit 16 to decrease the flow velocity of the supplied etching gas reaches the predetermined number of shots Y Bpls.

Further, in the above-described embodiments, the processor 120 may decrease the flow velocity of the etching gas from the first etching gas supply unit 16 and may not supply the etching gas from the second etching gas supply unit 17 when the amount of decrease in the reflectance of the EUV light concentrating mirror 15 is equal to or more than the reference value. Further, the processor 120 may control the first etching gas supply unit 16 and the second etching gas supply unit 17 such that the flow velocity of the etching gas flowing into the plasma generation region AR is kept constant between a state in which the flow velocity of the etching gas supplied from the first etching gas supply unit 16 is not decreased and a state in which the flow velocity of the etching gas supplied from the first etching gas supply unit 16 is decreased and the etching gas is supplied from the second etching gas supply unit 17.

The description above is intended to be illustrative and the present disclosure is not limited thereto. Therefore, it would be obvious to those skilled in the art that various modifications to the embodiments of the present disclosure would be possible without departing from the spirit and the scope of the appended claims. Further, it would be also obvious to those skilled in the art that embodiments of the present disclosure would be appropriately combined. The terms used throughout the present specification and the appended claims should be interpreted as non-limiting terms unless clearly described. For example, terms such as "comprise", "include", "have", and "contain" should not be interpreted to be exclusive of other structural elements. Further, indefinite articles "a/an" described in the present specification and the appended claims should be interpreted to mean "at least one" or "one or more." Further, "at least one of A, B, and C" should be interpreted to mean any of A, B, C, A+B, A+C, B+C, and A+B+C as well as to include combinations of the any thereof and any other than A, B, and C.

What is claimed is:

1. An extreme ultraviolet light generation chamber device comprising:
    a chamber configured to generate, at an internal space thereof, extreme ultraviolet light by irradiating a droplet target of tin with laser light to turn the droplet target into plasma;
    a partition wall having a cylindrical shape arranged at the internal space, the partition wall defining a first space outside the partition wall in the internal space and a second space including a plasma generation region where the droplet target turns into plasma and surrounded by the partition wall, the partition wall including a first opening and a second opening that communicate the first space with the second space;
    a target supply unit configured to supply the droplet target into the plasma generation region through the second opening;
    an extreme ultraviolet light concentrating mirror arranged in the first space and including a reflection surface which reflects the extreme ultraviolet light generated in the plasma generation region and incident through the first opening;
    a first etching gas supply unit configured to supply an etching gas containing a hydrogen gas to the reflection surface from the first space having a flow velocity at the reflection surface variable;
    a data generation unit configured to generate data reflecting reflectance of the extreme ultraviolet light concentrating mirror; and
    a processor configured to control the first etching gas supply unit to decrease the flow velocity and increase a hydrogen radical density on the reflection surface when the data indicates that an amount of decrease in the reflectance is equal to or more than a reference value.

2. The extreme ultraviolet light generation chamber device according to claim 1, comprising a second etching gas supply unit configured to supply an etching gas containing a hydrogen gas into the first space,
    wherein the processor controls, when the data indicates that the amount of decrease in the reflectance is equal to or more than the reference value, the first etching gas supply unit and the second etching gas supply unit to decrease the flow velocity of the etching gas supplied from the first etching gas supply unit and supply the etching gas from the second etching gas supply unit.

3. The extreme ultraviolet light generation chamber device according to claim 2,
    wherein the processor controls the first etching gas supply unit and the second etching gas supply unit such that the flow velocity of the etching gas flowing from the first etching gas supply unit and the second etching gas supply unit into the plasma generation region is kept constant between a state in which the flow velocity of the etching gas supplied from the first etching gas supply unit is not decreased and a state in which the flow velocity of the etching gas supplied from the first etching gas supply unit is decreased and the etching gas is supplied from the second etching gas supply unit.

4. The extreme ultraviolet light generation chamber device according to claim 1,
    wherein, when the data indicates that the amount of decrease in the reflectance is less than the reference value in a state that the first etching gas supply unit is controlled to decrease the flow velocity, the processor controls the first etching gas supply unit to increase the flow velocity.

5. The extreme ultraviolet light generation chamber device according to claim 1, comprising a pulse counter configured to count a number of shots of the laser light,
    wherein the processor controls the first etching gas supply unit to increase the flow velocity when the number of shots of the laser light after controlling the first etching gas supply unit to decrease the flow velocity reaches a predetermined number of shots.

6. The extreme ultraviolet light generation chamber device according to claim 1,
    wherein the data generation unit is an extreme ultraviolet light measurement instrument configured to measure power of the extreme ultraviolet light reflected by the extreme ultraviolet light concentrating mirror, and
    the data is data of the power of the extreme ultraviolet light measured by the extreme ultraviolet light measurement instrument and indicates that the amount of decrease in the reflectance is equal to or more than the reference value when indicating that the power of the extreme ultraviolet light has decreased by a predetermined value or more.

7. The extreme ultraviolet light generation chamber device according to claim 6,
- wherein the chamber includes a first emission port through which the extreme ultraviolet light reflected by the extreme ultraviolet light concentrating mirror is output to a subsequent process apparatus, and a second emission port through which the extreme ultraviolet light reflected by the extreme ultraviolet light concentrating mirror is output to the extreme ultraviolet light measurement instrument, and
- an optical path switching mirror switchable between a first state in which the extreme ultraviolet light reflected by the extreme ultraviolet light concentrating mirror is reflected to the first emission port and a second state in which the extreme ultraviolet light reflected by the extreme ultraviolet light concentrating mirror is reflected to the second emission port is provided at the internal space.

8. The extreme ultraviolet light generation chamber device according to claim 1, comprising:
- a laser light measurement instrument configured to measure power of the laser light and generate data related to the power; and
- an extreme ultraviolet light measurement instrument configured to measure power of the extreme ultraviolet light reflected by the extreme ultraviolet light concentrating mirror and generate data related to the power,
- wherein the data generation unit is a power ratio generation unit configured to generate a ratio between the power of the laser light measured by the laser light measurement instrument and the power of the extreme ultraviolet light measured by the extreme ultraviolet light measurement instrument, and
- the data is data of the ratio which indicates that the amount of decrease in the reflectance is equal to or more than the reference value when indicating that the power of the extreme ultraviolet light measured by the extreme ultraviolet light measurement instrument with respect to the power of the laser light measured by the laser light measurement instrument has decreased by a predetermined value or more.

9. The extreme ultraviolet light generation chamber device according to claim 8,
- wherein the chamber includes a first emission port through which the extreme ultraviolet light reflected by the extreme ultraviolet light concentrating mirror is output to a subsequent process apparatus, and a second emission port through which the extreme ultraviolet light reflected by the extreme ultraviolet light concentrating mirror is output to the extreme ultraviolet light measurement instrument, and
- an optical path switching mirror switchable between a first state in which the extreme ultraviolet light reflected by the extreme ultraviolet light concentrating mirror is reflected to the first emission port and a second state in which the extreme ultraviolet light reflected by the extreme ultraviolet light concentrating mirror is reflected to the second emission port is provided at the internal space.

10. The extreme ultraviolet light generation chamber device according to claim 1,
- wherein the data generation unit is a camera configured to image the reflection surface, and
- the data is data of an image imaged by the camera and indicates that the amount of decrease in the reflectance is equal to or more than the reference value when indicating that a ratio of an area where reflectance is deteriorated in the reflection surface is equal to or more than a predetermined ratio.

11. The extreme ultraviolet light generation chamber device according to claim 1, comprising a light source configured to irradiate the extreme ultraviolet light concentrating mirror with light,
- wherein the data generation unit is a light measurement instrument configured to measure power of the light specularly reflected by the extreme ultraviolet light concentrating mirror, and
- the data is data indicating the power of the light measured by the light measurement instrument and indicates that the amount of decrease in the reflectance is equal to or more than the reference value when indicating that the power of the light has decreased by a predetermined value or more.

12. The extreme ultraviolet light generation chamber device according to claim 1, comprising a light source configured to irradiate the extreme ultraviolet light concentrating mirror with light,
- wherein the data generation unit is a light measurement instrument configured to measure power of the light scattered by the extreme ultraviolet light concentrating mirror, and
- the data is data indicating the power of the light measured by the light measurement instrument and indicates that the amount of decrease in the reflectance is equal to or more than the reference value when indicating that the power of the light has increased by a predetermined value or more.

13. The extreme ultraviolet light generation chamber device according to claim 1,
- wherein the data generation unit is a pulse counter configured to count a number of shots of the laser light, and
- the data is data indicating the number of shots counted by the pulse counter and indicates that the amount of decrease in the reflectance is equal to or more than the reference value when indicating that the number of shots is equal to or more than a predetermined value.

14. The extreme ultraviolet light generation chamber device according to claim 1, wherein the partition wall has a gas exhaust port facing the first opening, and the gas exhaust port is connected to an exhaust device.

15. The extreme ultraviolet light generation chamber device according to claim 14, wherein the etching gas supplied to the reflection surface flows into the second space through the first opening and is suctioned by the exhaust device.

16. The extreme ultraviolet light generation chamber device according to claim 15, wherein the first opening allows the extreme ultraviolet light generated in the second space to pass toward the extreme ultraviolet light concentrating mirror and allows the etching gas supplied to the first space to pass toward the exhaust device.

17. An electronic device manufacturing method comprising:
- outputting extreme ultraviolet light generated using an extreme ultraviolet light generation apparatus to an exposure apparatus; and
- exposing a photosensitive substrate to the extreme ultraviolet light in the exposure apparatus to manufacture an electronic device,
- the extreme ultraviolet light generation apparatus including an extreme ultraviolet light generation chamber device including:

a chamber configured to generate, at an internal space thereof, the extreme ultraviolet light by irradiating a droplet target of tin with laser light to turn the droplet target into plasma;

a partition wall having a cylindrical shape arranged at the internal space, the partition wall defining a first space outside the partition wall in the internal space and a second space including a plasma generation region where the droplet target turns into plasma and surrounded by the partition wall, the partition wall including a first opening and a second opening that communicate the first space with the second space;

a target supply unit configured to supply the droplet target into the plasma generation region through the second opening;

an extreme ultraviolet light concentrating mirror arranged in the first space and including a reflection surface which reflects the extreme ultraviolet light generated in the plasma generation region and incident through the first opening;

a first etching gas supply unit configured to supply an etching gas containing a hydrogen gas to the reflection surface from the first space having a flow velocity at the reflection surface variable;

a data generation unit configured to generate data reflecting reflectance of the extreme ultraviolet light concentrating mirror; and a processor configured to control the first etching gas supply unit to decrease the flow velocity and increase a hydrogen radical density on the reflection surface when the data indicates that an amount of decrease in the reflectance is equal to or more than a reference value.

18. An electronic device manufacturing method comprising:

inspecting a defect of a mask by irradiating the mask with extreme ultraviolet light generated using an extreme ultraviolet light generation apparatus;

selecting a mask using a result of the inspecting; and exposing and transferring a pattern formed on the selected mask onto a photosensitive substrate, the extreme ultraviolet light generation apparatus including an extreme ultraviolet light generation chamber device including:

a chamber configured to generate, at an internal space thereof, extreme ultraviolet light by irradiating a droplet target of tin with laser light to turn the droplet target into plasma;

a partition wall having a cylindrical shape arranged at the internal space, the partition wall defining a first space outside the partition wall in the internal space and a second space including a plasma generation region where the droplet target turns into plasma and surrounded by the partition wall, the partition wall including a first opening and a second opening that communicate the first space with the second space;

a target supply unit configured to supply the droplet target into the plasma generation region through the second opening;

an extreme ultraviolet light concentrating mirror arranged in the first space and including a reflection surface which reflects the extreme ultraviolet light generated in the plasma generation region and incident through the first opening;

a first etching gas supply unit configured to supply an etching gas containing a hydrogen gas to the reflection surface from the first space having a flow velocity at the reflection surface variable;

a data generation unit configured to generate data reflecting reflectance of the extreme ultraviolet light concentrating mirror; and a processor configured to control the first etching gas supply unit to decrease the flow velocity and increase a hydrogen radical density on the reflection surface when the data indicates that an amount of decrease in the reflectance is equal to or more than a reference value.

* * * * *